(12) United States Patent
Reeves et al.

(10) Patent No.: US 9,122,441 B2
(45) Date of Patent: *Sep. 1, 2015

(54) OPENING APPLICATIONS IN UNIFIED DESKTOP

(75) Inventors: Paul E. Reeves, Oakville (CA); Sanjiv Sirpal, Oakville (CA); Alexander de Paz, Burlington (CA); Martin Gimpl, Helsinki (FI)

(73) Assignee: Z124, George Town (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/410,958

(22) Filed: Mar. 2, 2012

(65) Prior Publication Data

US 2013/0080933 A1     Mar. 28, 2013

Related U.S. Application Data

(60) Provisional application No. 61/539,884, filed on Sep. 27, 2011.

(51) Int. Cl.
*G06F 3/14* (2006.01)
*G09G 5/34* (2006.01)
(Continued)

(52) U.S. Cl.
CPC ........ *G06F 3/1423* (2013.01); *B29D 11/00673* (2013.01); *E05D 3/12* (2013.01); *G02B 6/0001* (2013.01); *G06F 1/1601* (2013.01); *G06F 1/1616* (2013.01); *G06F 1/1637* (2013.01); *G06F 1/1641* (2013.01); *G06F 1/1649* (2013.01); *G06F 1/1692* (2013.01); *G06F 3/01* (2013.01); *G06F 3/041* (2013.01); *G06F 3/048* (2013.01); *G06F 3/0412* (2013.01);
(Continued)

(58) Field of Classification Search
CPC ... G06F 1/1616; G06F 1/1692; G06F 3/1423; G06F 3/1438; G06F 3/1446; G09G 2300/026
USPC ........................................... 715/761; 345/1.3
See application file for complete search history.

(56) References Cited

U.S. PATENT DOCUMENTS 5,390,295 A   2/1995  Bates et al.
5,467,102 A   11/1995  Kuno et al.
(Continued)

OTHER PUBLICATIONS

HiTechExpress, "iPhone 4 with a $5 aftermarket tv-out cable and games on TV", Jan 5, 2011, [retrieved on Jun. 12, 2013], retrieved from the Internet: <URL: http://www.youtube.com/watch?v=p70LtLKhQRY/>, p. 1-2.*

(Continued)

*Primary Examiner* — Patrick Riegler
*Assistant Examiner* — Mong-Shune Chung
(74) *Attorney, Agent, or Firm* — Sheridan Ross P.C.

(57) ABSTRACT

Embodiments provide for a handheld device with a unified desktop for integrating the functionality of the handheld device with a larger computer system. When connected to a peripheral display and/or a display of the larger computer system, the handheld device provides a unified desktop displayed across the screen(s) of the handheld device and the peripheral display. The unified desktop unifies the functionality provided by the larger computer system and the handheld functionality, e.g., communication applications (e.g., phone, SMS, MMS). A user can seamlessly interact with applications, e.g., open, move, close, receive notifications, on the unified desktop whether the applications are displayed on the screens of the handheld device, or the peripheral display of the larger computer system.

19 Claims, 34 Drawing Sheets

(51) Int. Cl.
| | |
|---|---|
| *H04M 1/02* | (2006.01) |
| *G06F 1/16* | (2006.01) |
| *G09G 5/00* | (2006.01) |
| *G06F 3/041* | (2006.01) |
| *G09G 1/00* | (2006.01) |
| *H05K 5/02* | (2006.01) |
| *H05K 5/00* | (2006.01) |
| *H05K 13/00* | (2006.01) |
| *H04N 5/445* | (2011.01) |
| *H05K 7/02* | (2006.01) |
| *E05D 3/12* | (2006.01) |
| *H05K 13/04* | (2006.01) |
| *H05K 5/04* | (2006.01) |
| *H05K 7/14* | (2006.01) |
| *B29D 11/00* | (2006.01) |
| *F21V 8/00* | (2006.01) |
| *G06F 3/01* | (2006.01) |
| *G06F 3/048* | (2013.01) |
| *G06F 3/0489* | (2013.01) |
| *G06T 3/00* | (2006.01) |
| *G06F 9/44* | (2006.01) |
| *G06F 3/0481* | (2013.01) |
| *G06F 3/0483* | (2013.01) |
| *G06F 3/0488* | (2013.01) |
| *G09G 5/14* | (2006.01) |
| *H04W 48/18* | (2009.01) |
| *H04W 72/06* | (2009.01) |
| *H04W 88/06* | (2009.01) |

(52) U.S. Cl.
CPC ........... *G06F3/0481* (2013.01); *G06F 3/0483* (2013.01); *G06F 3/04883* (2013.01); *G06F 3/04897* (2013.01); *G06F 9/44* (2013.01); *G06F 9/4443* (2013.01); *G06T 3/00* (2013.01); *G09G 1/00* (2013.01); *G09G 5/00* (2013.01); *G09G 5/14* (2013.01); *G09G 5/34* (2013.01); *H04M 1/0266* (2013.01); *H04N 5/44591* (2013.01); *H04W 48/18* (2013.01); *H04W 72/06* (2013.01); *H04W 88/06* (2013.01); *H05K 5/0017* (2013.01); *H05K 5/0226* (2013.01); *H05K 5/04* (2013.01); *H05K 7/02* (2013.01); *H05K 7/1452* (2013.01); *H05K 13/00* (2013.01); *H05K 13/046* (2013.01); *E05Y 2900/606* (2013.01); *G06F 3/1438* (2013.01); *G06F 3/1446* (2013.01); *Y10T 16/547* (2015.01); *Y10T 29/4984* (2015.01); *Y10T 29/49826* (2015.01)

(56) References Cited

U.S. PATENT DOCUMENTS

| | | | |
|---|---|---|---|
| 5,694,150 A | 12/1997 | Sigona et al. | |
| 5,748,189 A | 5/1998 | Trueblood | |
| 5,923,307 A | 7/1999 | Hogle | |
| 5,925,117 A | 7/1999 | Kirby et al. | |
| 6,018,340 A | 1/2000 | Butler et al. | |
| 6,859,219 B1 | 2/2005 | Sal | |
| 6,871,349 B2 | 3/2005 | Akhond et al. | |
| 6,919,864 B1 | 7/2005 | Macor | |
| 7,030,837 B1 | 4/2006 | Vong | |
| 7,139,529 B2 | 11/2006 | Rekimoto et al. | |
| 7,299,422 B2 | 11/2007 | Levine et al. | |
| 7,460,086 B1 | 12/2008 | Cunningham et al. | |
| 7,685,603 B2 | 3/2010 | Singler et al. | |
| 7,783,753 B2 | 8/2010 | Shuster | |
| 7,870,496 B1 | 1/2011 | Sherwani | |
| 7,954,064 B2 | 5/2011 | Forstall et al. | |
| 7,996,390 B2 | 8/2011 | Freire et al. | |
| 7,996,789 B2 | 8/2011 | Louch et al. | |
| 8,037,222 B2 | 10/2011 | Brune et al. | |
| 8,072,392 B2 | 12/2011 | Lection | |
| 8,266,550 B1 | 9/2012 | Cleron et al. | |
| 8,266,551 B2 | 9/2012 | Boldyrev et al. | |
| 8,276,085 B2 | 9/2012 | Sherwani | |
| 8,296,728 B1 | 10/2012 | Webster | |
| 8,352,879 B2 | 1/2013 | Leung et al. | |
| 8,355,755 B2 | 1/2013 | Kim et al. | |
| 8,368,616 B1 | 2/2013 | Harris | |
| 8,400,564 B2 | 3/2013 | Jacobs | |
| 8,446,377 B2 | 5/2013 | Estrada et al. | |
| 8,464,180 B1 | 6/2013 | Kirkham et al. | |
| 8,489,999 B2 | 7/2013 | Harvey et al. | |
| 8,506,411 B2 | 8/2013 | Shimizu et al. | |
| 8,589,952 B2 | 11/2013 | Wong et al. | |
| 8,634,873 B2 | 1/2014 | Jones et al. | |
| 2002/0196287 A1 | 12/2002 | Taylor et al. | |
| 2003/0101431 A1 | 5/2003 | Duesterwald et al. | |
| 2003/0212862 A1 | 11/2003 | James | |
| 2004/0049743 A1 | 3/2004 | Bogward | |
| 2004/0201628 A1 | 10/2004 | Johanson et al. | |
| 2004/0261037 A1 | 12/2004 | Ording et al. | |
| 2005/0143137 A1 | 6/2005 | Matsunaga et al. | |
| 2005/0248502 A1 | 11/2005 | Okuley et al. | |
| 2005/0268301 A1 | 12/2005 | Kelley et al. | |
| 2006/0048062 A1 | 3/2006 | Adamson | |
| 2006/0107229 A1 | 5/2006 | Matthews et al. | |
| 2006/0112339 A1 | 5/2006 | Struthers et al. | |
| 2006/0150109 A1 | 7/2006 | Schultz et al. | |
| 2006/0161847 A1 | 7/2006 | Holecek et al. | |
| 2006/0230156 A1 | 10/2006 | Shappir et al. | |
| 2007/0010289 A1 | 1/2007 | Mezue | |
| 2007/0113190 A1 | 5/2007 | Clark et al. | |
| 2007/0174410 A1 | 7/2007 | Croft et al. | |
| 2007/0178952 A1 | 8/2007 | Ehara et al. | |
| 2007/0198476 A1 | 8/2007 | Farago et al. | |
| 2007/0260998 A1 | 11/2007 | Levine et al. | |
| 2007/0266335 A1 | 11/2007 | Sielinski et al. | |
| 2007/0288599 A1 | 12/2007 | Saul et al. | |
| 2007/0296643 A1 | 12/2007 | Ben-Shachar et al. | |
| 2008/0028321 A1* | 1/2008 | Weksler et al. | 715/748 |
| 2008/0109753 A1 | 5/2008 | Karstens | |
| 2008/0307352 A1 | 12/2008 | Chaudhri et al. | |
| 2009/0000169 A1 | 1/2009 | Houssain et al. | |
| 2009/0094523 A1 | 4/2009 | Treder et al. | |
| 2009/0102744 A1* | 4/2009 | Ram | 345/1.1 |
| 2009/0132923 A1 | 5/2009 | Han et al. | |
| 2009/0193340 A1 | 7/2009 | Mahajan et al. | |
| 2009/0254861 A1* | 10/2009 | Seetharamakrishnan et al. | 715/810 |
| 2009/0278806 A1 | 11/2009 | Duarte et al. | |
| 2009/0328033 A1 | 12/2009 | Kohavi et al. | |
| 2010/0019989 A1 | 1/2010 | Odagawa et al. | |
| 2010/0053164 A1 | 3/2010 | Imai et al. | |
| 2010/0060572 A1 | 3/2010 | Tsern | |
| 2010/0064228 A1 | 3/2010 | Tsern | |
| 2010/0066698 A1 | 3/2010 | Seo | |
| 2010/0079355 A1 | 4/2010 | Kilpatrick et al. | |
| 2010/0085274 A1 | 4/2010 | Kilpatrick et al. | |
| 2010/0085382 A1 | 4/2010 | Lundqvist et al. | |
| 2010/0111491 A1 | 5/2010 | Kamoto | |
| 2010/0121959 A1 | 5/2010 | Lin et al. | |
| 2010/0138730 A1 | 6/2010 | Olafsen et al. | |
| 2010/0138780 A1 | 6/2010 | Marano et al. | |
| 2010/0156913 A1 | 6/2010 | Ortega et al. | |
| 2010/0185955 A1 | 7/2010 | Kato et al. | |
| 2010/0211950 A1 | 8/2010 | Kusko et al. | |
| 2010/0250816 A1 | 9/2010 | Collopy et al. | |
| 2010/0251243 A1 | 9/2010 | Gill et al. | |
| 2010/0254525 A1 | 10/2010 | Maly et al. | |
| 2010/0262928 A1 | 10/2010 | Abbott | |
| 2010/0293504 A1 | 11/2010 | Hachiya | |
| 2010/0295802 A1 | 11/2010 | Lee | |
| 2010/0313165 A1 | 12/2010 | Louch et al. | |
| 2010/0333088 A1 | 12/2010 | Rogel et al. | |
| 2011/0018821 A1 | 1/2011 | Kii | |
| 2011/0050608 A1 | 3/2011 | Homma et al. | |
| 2011/0093691 A1 | 4/2011 | Galicia et al. | |

(56) References Cited

U.S. PATENT DOCUMENTS

| | | | |
|---|---|---|---|
| 2011/0093836 A1 | 4/2011 | Galicia et al. |
| 2011/0138314 A1 | 6/2011 | Mir et al. |
| 2011/0146904 A1 | 6/2011 | Kashiwagi et al. |
| 2011/0191690 A1 | 8/2011 | Zhang et al. |
| 2011/0209058 A1 | 8/2011 | Hinckley et al. |
| 2011/0209104 A1 | 8/2011 | Hinckley et al. |
| 2011/0210907 A1 | 9/2011 | Martin-Cocher et al. |
| 2011/0225553 A1 | 9/2011 | Abramson et al. |
| 2011/0246894 A1 | 10/2011 | Luo et al. |
| 2011/0246904 A1 | 10/2011 | Pinto et al. |
| 2011/0252317 A1 | 10/2011 | Keranen et al. |
| 2011/0291964 A1 | 12/2011 | Chambers et al. |
| 2011/0296343 A1 | 12/2011 | Leung et al. |
| 2012/0023563 A1 | 1/2012 | Morgenstern et al. |
| 2012/0040623 A1 | 2/2012 | Liu et al. |
| 2012/0050183 A1 | 3/2012 | Lee |
| 2012/0066624 A1 | 3/2012 | Kwak et al. |
| 2012/0066643 A1 | 3/2012 | McRae |
| 2012/0072853 A1 | 3/2012 | Krigström et al. |
| 2012/0075204 A1 | 3/2012 | Murray et al. |
| 2012/0081277 A1 | 4/2012 | de Paz |
| 2012/0081353 A1 | 4/2012 | Yusupov et al. |
| 2012/0081380 A1 | 4/2012 | Reeves et al. |
| 2012/0081383 A1 | 4/2012 | Reeves et al. |
| 2012/0081396 A1 | 4/2012 | Yusupov et al. |
| 2012/0084480 A1 | 4/2012 | Reeves et al. |
| 2012/0084481 A1 | 4/2012 | Reeves et al. |
| 2012/0084542 A1 | 4/2012 | Reeves et al. |
| 2012/0084736 A1 | 4/2012 | Sirpal |
| 2012/0084737 A1 | 4/2012 | Gimpl et al. |
| 2012/0084791 A1 | 4/2012 | Benedek et al. |
| 2012/0084792 A1 | 4/2012 | Benedek et al. |
| 2012/0084793 A1 | 4/2012 | Reeves et al. |
| 2012/0084798 A1 | 4/2012 | Reeves et al. |
| 2012/0086716 A1 | 4/2012 | Reeves et al. |
| 2012/0086717 A1 | 4/2012 | Liu |
| 2012/0087078 A1 | 4/2012 | Medica et al. |
| 2012/0089906 A1 | 4/2012 | Reeves et al. |
| 2012/0089992 A1 | 4/2012 | Reeves et al. |
| 2012/0117290 A1 | 5/2012 | Sirpal et al. |
| 2012/0124245 A1 | 5/2012 | Reeves et al. |
| 2012/0143944 A1 | 6/2012 | Reeves et al. |
| 2012/0166985 A1 | 6/2012 | Friend et al. |
| 2012/0167004 A1 | 6/2012 | Gordner et al. |
| 2012/0174021 A1 | 7/2012 | Dharawat |
| 2012/0226742 A1 | 9/2012 | Momchilov et al. |
| 2012/0249429 A1 | 10/2012 | Anderson et al. |
| 2012/0260198 A1 | 10/2012 | Choi et al. |
| 2012/0266098 A1 | 10/2012 | Webber |
| 2012/0278727 A1 | 11/2012 | Ananthakrishnan et al. |
| 2012/0303476 A1 | 11/2012 | Krzyzanowski et al. |
| 2012/0311457 A1 | 12/2012 | O'Gorman |
| 2013/0007178 A1 | 1/2013 | Nahidipour |
| 2013/0019183 A1 | 1/2013 | Reeves |
| 2013/0021262 A1 | 1/2013 | Chen |
| 2013/0024778 A1 | 1/2013 | Reeves |
| 2013/0024812 A1 | 1/2013 | Reeves |
| 2013/0109371 A1 | 5/2013 | Brogan et al. |
| 2013/0111415 A1 | 5/2013 | Reeves et al. |
| 2013/0208417 A1 | 8/2013 | Sirpal |
| 2013/0219303 A1 | 8/2013 | Eriksson et al. |
| 2013/0244784 A1 | 9/2013 | Assa |
| 2013/0342638 A1 | 12/2013 | Sobti et al. |
| 2014/0312827 A1 | 10/2014 | Medica et al. |

OTHER PUBLICATIONS

Actualtools, "Windows 7 Dual Monitor Taskbar: How to Extend Windows 7 Taskbar to a Second Monitor", Dec. 18, 2010, [retrieved on Dec. 18, 2013], retrieved from the Internet <URL: web.archive.org/web/20101218162954/http://www.actualtools.com/articles/detail.php?ID=1265/>, p. 1-7.*

Chris Fehily, "Visual Quickstart Guide Microsoft Windows 7", Sep. 8, 2009, Peachpit Press, p. 1-3.*

U.S. Appl. No. 13/408,530, filed Feb. 29, 2012, Reeves et al.
U.S. Appl. No. 13/410,931, filed Mar. 2, 2012, Reeves et al.
U.S. Appl. No. 13/410,983, filed Mar. 2, 2012, Reeves et al.
U.S. Appl. No. 13/411,034, filed Mar. 2, 2012, Reeves et al.
U.S. Appl. No. 13/411,075, filed Mar. 2, 2012, Reeves et al.
U.S. Appl. No. 13/436,593, filed Mar. 30, 2012, Reeves et al.
U.S. Appl. No. 13/436,823, filed Mar. 30, 2012, Reeves et al.
U.S. Appl. No. 13/436,826, filed Mar. 30, 2012, Reeves et al.
U.S. Appl. No. 13/485,734, filed May 31, 2012, Reeves et al.
U.S. Appl. No. 13/485,743, filed May 31, 2012, Reeves et al.
U.S. Appl. No. 13/543,635, filed Jul. 6, 2012, Reeves et al.
U.S. Appl. No. 13/543,678, filed Jul. 6, 2012, Reeves et al.
U.S. Appl. No. 13/566,103, filed Aug. 3, 2012, Reeves et al.
U.S. Appl. No. 13/566,168, filed Aug. 3, 2012, Reeves et al.
U.S. Appl. No. 13/566,244, filed Aug. 3, 2012, Reeves et al.
U.S. Appl. No. 13/566,336, filed Aug. 3, 2012, Sirpal et al.
U.S. Appl. No. 13/603,136, filed Sep. 4, 2012, Reeves et al.
U.S. Appl. No. 13/604,384, filed Sep. 5, 2012, Reeves et al.
U.S. Appl. No. 13/604,960, filed Sep. 6, 2012, Reeves et al.
U.S. Appl. No. 13/605,145, filed Sep. 6, 2012, Reeves et al.
U.S. Appl. No. 13/605,740, filed Sep. 6, 2012, Reeves et al.
U.S. Appl. No. 13/605,482, filed Sep. 6, 2012, Reeves et al.
U.S. Appl. No. 13/627,690, filed Sep. 26, 2012, Reeves et al.
U.S. Appl. No. 13/627,698, filed Sep. 26, 2012, Reeves et al.
U.S. Appl. No. 13/627,708, filed Sep. 26, 2012, Reeves et al.

Google Image Result for Fujitsu Dual Screen Phone, published date unknown, [retrieved Apr. 18, 2011], 1 page. Retrieved from: www.google.com/imgres?imgurl=http://www.computerriver.com/images/dual-screen-phone.jpg.

Google Image Result for LG Dual Touch Screen Concept Phone by Eugene Kim, published date unknown, [retrieved Apr. 18, 2011], 1 page. Retrieved from: www.google.com/imgres?imgurl=http://fgadgets.com/wp-content/uploads/2010/08/lg-dual-touch-screen-phone-Eugene-Kim-01.jpg.

Google Image Result for Fujitsu Dual Screen Phone, published date unknown, [retrieved Apr. 18, 2011], 1 page. Retrieved from: www.google.com/imgres?imgurl=http://www.gsmdome.com/wp-content/uploads/2010/10/fujitsu-dual-screen-phone_w2cP7_54.jpg.

Google Image Result for Kyocera Echo, published date unknown, [retrieved Apr. 18, 2011], 1 page. Retrieved from: www.google.com/imgres?imgurl=http://www.hardwaresphere.com/wp-content/uploads/2011/02/kyocera-echo-dual-screen-android-phone-for-sprint-network.jpg.

Google Image Result for HTC Triple Viper, published date unknown, [retrieved Apr. 18, 2011], 1 page. Retrieved from:www.google.com/imgres?imgurl=http://www.santafemods.com/Forum/AndroidForums/htcTripleViper.png.

Google Image Result for Dual-Screen Phone, [retrieved Apr. 18, 2011], 1 page. Retrieved from: www.google.com/imgres?imgurl=http://www.netshet.org/wp-content/uploads/2011/02/Dual-Scree . . . .

Website entitled, "Kyocera Echo," Kyocera Communications, Inc., 2011, [retrieved on Aug. 27, 2012], 6 pages. Retrieved from: www.echobykyocera.com/.

Website entitled "Lapdock™ for Motorola Atrix," Motorola Mobility, Inc, 2011, [retrieved on Apr. 18, 2011], 1 page. Retrieved from: www.motorola.com/Consumers/US-EN/Consumer-Product-and-Services/Mobile+Ph . . . .

Website entitled "Motorola Atrix 4G Laptop Dock Review," phoneArena.com, posted Mar. 2, 2011, [retrieved on Apr. 18, 2011], 6 pages. Retrieved from:www.phonearena.com/reviews/Motorola-ATRIX-4G-Laptop-Dock-Review_id2667.

Website entitled, "Sony Tablet," Sony Corporation, 2012, [retrieved on Aug. 27, 2012], 3 pages. Retrieved from: www.store.sony.com/webapp/wcs/stores/servlet/CategoryDisplay?catalogId=10551&storeId=10151&langId=-1&categoryId=8198552921644795521.

Burns, C., "Motorola ATRIX 4G Laptop Dock Review," Android Community, Feb. 20, 2011, [retrieved on Apr. 18, 2011], 5 pages. Retrieved from: www.androidcommunity.com/motorola-atrix-4g-laptop-dock-review-20110220/.

Catacchio, "This smartphone has two huge screens . . . that rotate," The Next Web, Inc., Oct. 7, 2010, [retrieved on Jul. 21, 2011], 2

(56) References Cited

OTHER PUBLICATIONS pages. Retrieved from: www.thenextweb.com/asia/2010/10/07/this-smartphone-has-two-huge-screens-that-rotate/.
Posted by Harman03, "Kyocera Echo Dual-screen Android Phone," posted 4 weeks from Apr. 18, 2011, [retrieved on Apr. 18, 2011], 3 pages. Retrieved from: www.unp.me/f106/kyocera-echo-dual-screen-android-phone-143800/.
Stein, S., "How does the Motorola Atrix 4G Lapdock compare with a laptop?" Crave—CNET, Feb. 9, 2011 [retrieved on Apr. 18, 2011], 7 pages. Retrieved from: www.news.cnet.com/8301-17938_105-20031251-1.html.
Toshiba Leading Innovation, User's Manual, Librettow W100, Jun. 2010, First edition, 119 pages.
U.S. Appl. No. 13/843,086, filed Mar. 15, 2013, Reeves et al.
Official Action for U.S. Appl. No. 13/408,530, mailed Jul. 3, 2013 16 pages.
Official Action for U.S. Appl. No. 13/436,593, mailed Sep. 10, 2013 26 pages.
Official Action for U.S. Appl. No. 13/410,983, mailed Jun. 27, 2013 14 pages.
Official Action for U.S. Appl. No. 13/411,034, mailed Jul. 19, 2013 13 pages.
Official Action for U.S. Appl. No. 13/436,823, mailed Sep. 12, 2013 25 pages.
"Manually Adding iTunes Music to iPod (screen shot circa frame at 42-43 seconds)," Feb. 8, 2009, 1 page. Retrieved from: www.youtube.com/watch?v=C0oxo1soApw.
"Using VMware Fusion at Middlefield," (screen shot) Jan. 21, 2010, 1 page, retrieved from http://web.archive.org/web/20100121065605/http://hub.fotthill.edu/howtos/fusion.
Official Action for U.S. Appl. No. 13/603,136, mailed Oct. 16, 2014 26 pages.
Official Action for U.S. Appl. No. 13/408,530, mailed Jul. 2, 2014 14 pages.
Official Action for U.S. Appl. No. 13/485,734, mailed Sep. 12, 2014 17 pages.
Notice of Allowance for U.S. Appl. No. 13/485,743, mailed Jun. 25, 2014 5 pages.
Official Action for U.S. Appl. No. 13/543,678, mailed Jan. 15, 2015 13 pages.
Official Action for U.S. Appl. No. 13/627,690, mailed Nov. 5, 2014 20 pages.
Official Action for U.S. Appl. No. 13/627,708, mailed Oct. 24, 2014 13 pages.
Notice of Allowance for U.S. Appl. No. 13/410,983, mailed Oct. 24, 2014 16 pages.
Official Action for U.S. Appl. No. 13/411,075, mailed Aug. 15, 2014 17 pages.
Official Action for U.S. Appl. No. 13/436,823, mailed Jan. 7, 2015 40 pages.
Official Action for U.S. Appl. No. 13/566,103, mailed Nov. 20, 2014 16 pages.
Official Action for U.S. Appl. No. 13/566,168, mailed Oct. 23, 2014 42 pages.
Official Action for U.S. Appl. No. 13/566,244, mailed Oct. 24, 2014 35 pages.
Official Action for U.S. Appl. No. 13/566,336, mailed Dec. 1, 2014 18 pages.
Official Action for U.S. Appl. No. 13/834,289, mailed Dec. 17, 2014 6 pages Restriction Requirement.
Official Action for U.S. Appl. No. 13/603,136, mailed Apr. 28, 2014 28 pages.
Official Action for U.S. Appl. No. 13/408,530, mailed Jan. 29, 2014 14 pages.
Official Action for U.S. Appl. No. 13/436,593, mailed Jan. 16, 2014 25 pages.
Official Action for U.S. Appl. No. 13/485,734, mailed Feb. 10, 2014 15 pages.
Notice of Allowance for U.S. Appl. No. 13/485,734, mailed Jun. 3, 2014 5 pages.
Official Action for U.S. Appl. No. 13/485,743, mailed Feb. 20, 2014 19 pages.
Official Action for U.S. Appl. No. 13/627,690, mailed Jun. 5, 2014 25 pages.
Official Action for U.S. Appl. No. 13/410,931, mailed Nov. 25, 2013 9 pages.
Notice of Allowance for U.S. Appl. No. 13/410,931, mailed May 23, 2014 7 pages.
Official Action for U.S. Appl. No. 13/410,983, mailed Jan. 3, 2014 17 pages.
Official Action for U.S. Appl. No. 13/410,983, mailed Apr. 10, 2014 16 pages.
Official Action for U.S. Appl. No. 13/411,034, mailed Dec. 20, 2013 13 pages.
Notice of Allowance for U.S. Appl. No. 13/411,034, mailed May 15, 2014 7 pages.
Official Action for U.S. Appl. No. 13/411,075, mailed Mar. 20, 2014 17 pages.
Official Action for U.S. Appl. No. 13/436,823, mailed Jan. 31, 2014 22 pages.
Official Action for U.S. Appl. No. 13/436,826, mailed Oct. 28, 2013 19 pages.
Official Action for U.S. Appl. No. 13/436,826, mailed May 27, 2014 25 pages.
Official Action for U.S. Appl. No. 13/566,168, mailed May 1, 2014 34 pages.
Official Action for U.S. Appl. No. 13/566,244, mailed May 9, 2014 26 pages.

\* cited by examiner

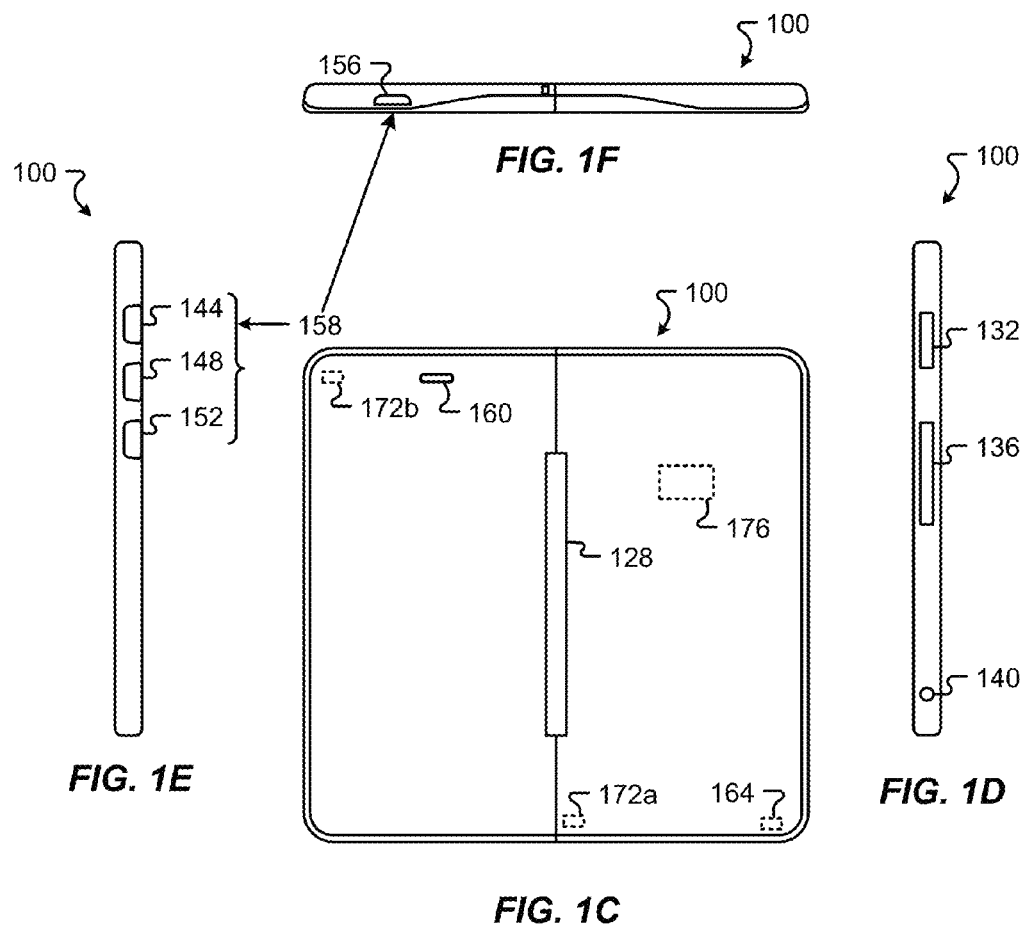

|  |  | PORTRAIT | | | | | | LANDSCAPE | | | | | |
|---|---|---|---|---|---|---|---|---|---|---|---|---|---|
|  |  | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
| P O R T R A I T | OPEN | X | HT | HT | HT | P | I | AT | HAT | HAT | HAT | P | I |
| | CLOSED | HT | X | HAT | HAT | P | I | HAT | AT | HAT | HAT | P | I |
| | EASEL | HT | HT | X | X | P | I | HAT | HAT | HAT | HAT | P | I |
| | PHONE | HT | X | HT | HT | X | X | HAT | HAT | HAT | HAT | X | HAT |
| | IMAGE/VIDEO | HT | HT | HT | X | P | I | HT | HT | HT | HT | P | I |
| L A N D S C A P E | OPEN | AT | HAT | HAT | HAT | P | I | X | HT | HAT | HAT | P | I |
| | CLOSED | HAT | AT | HAT | HAT | P | I | HT | X | HAT | HAT | P | I |
| | EASEL | HAT | HAT | HAT | HAT | P | I | HT | HT | X | HAT | P | I |
| | MODIFIED EASEL | HAT | HAT | HAT | HAT | P | I | HT | HT | HT | X | P | I |
| | IMAGE/VIDEO | HAT | HAT | HAT | HAT | HAT | AT | HT | HT | HT | HAT | P | X |
| | DOCKED | | | | | | | | | | | | |

DOCKING SIGNAL

Key:
H – Hall Effect Sensor(s)
a – accelerometer(s)
T – Timer
P – communications Trigger
I – Image / Video capture Request

FIG. 3B

Tap

Long Press

Drag

Flick

Pinch

Spread

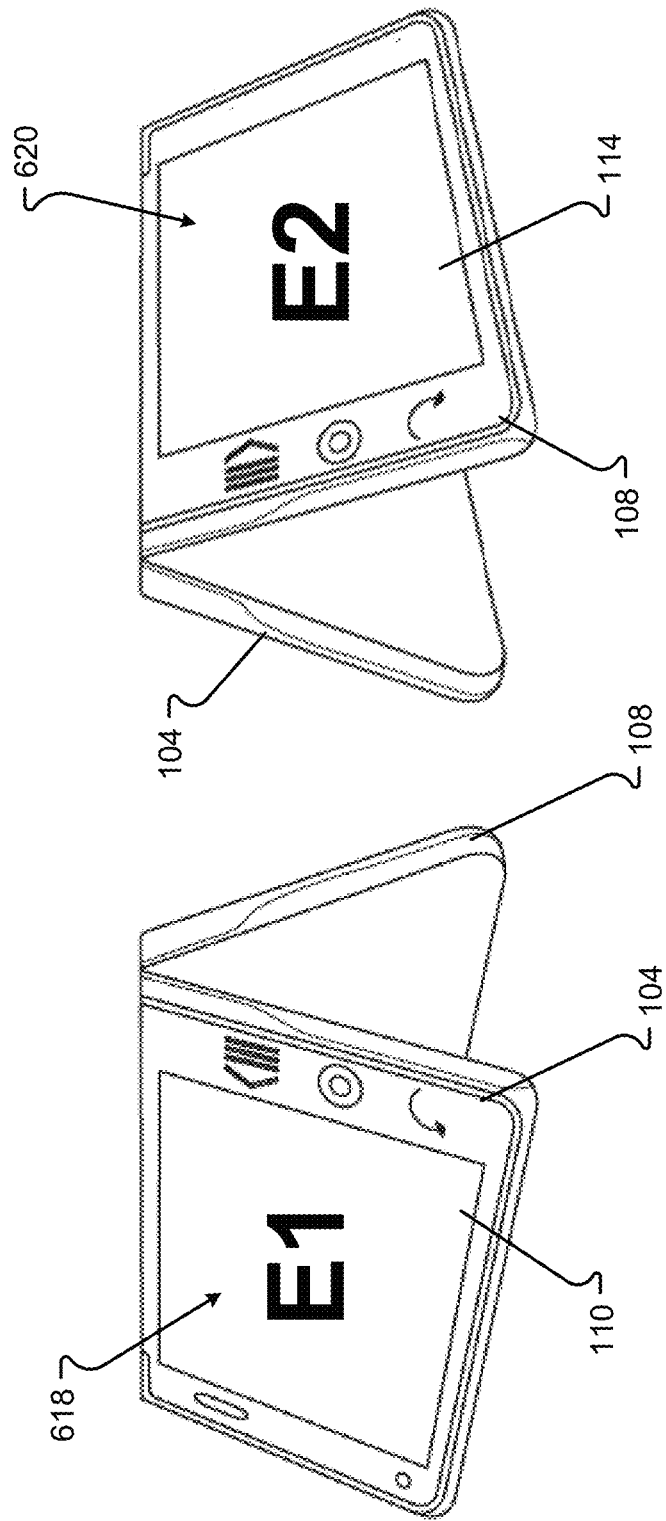

OPENING APPLICATIONS IN UNIFIED DESKTOP

CROSS REFERENCE TO RELATED APPLICATIONS

The present application claims the benefits of and priority, under 35 U.S.C. §119(e), to U.S. Provisional Application Ser. No. 61/539,884, filed Sep. 27, 2011, entitled "MOBILE DEVICE." This application is also related to U.S. application Ser. No. 13/217,108, filed on Aug. 24, 2011, now U.S. Pat. No. 8,898,443; Ser. No. 13/251,427, filed on Oct. 3, 2011; Ser. No. 13/247,166, filed on Sep. 28, 2011, now U.S. Pat. No. 8,683,496; Ser. No. 13/217,121, filed on Aug. 24, 2011; Ser. No. 13/217,130, filed on Aug. 24, 2011, now U.S. Pat. No. 9,026,709; Ser. No. 13/247,170, filed on Sep. 28, 2011, now U.S. Pat. No. 8,957,905; Ser. No. 13/246,669, filed on Sep. 27, 2011, now U.S. Pat. No. 8,819,705; Ser. No. 13/217,099, filed on Aug. 24, 2011, now U.S. Pat. No. 9,098,437; Ser. No. 13/247,885, filed on Sep. 28, 2011, now U.S. Pat. No. 8,726,294; Ser. No. 13/250,764, filed on Sep. 30, 2011, now U.S. Pat. No. 9,071,625; Ser. No. 13,251,434, filed on Oct. 3, 2011, now U.S. Pat. No. 8,819,180; Ser. No. 13/399,901, filed on Feb. 17, 2012; Ser. No. 13/399,929, filed on Feb. 17, 2012; Ser. No. 13/399,936, filed on Feb. 17, 2012, now U.S. Pat. No. 8,966,379; Ser. No. 13/246,118, filed on Sep. 27, 2011, now U.S. Pat. No. 9,077,731; Ser. No. 13/246,128, filed on Sep. 27, 2011, now U.S. Pat. No. 9,060,006; Ser. No. 13/246,133, filed on Sep. 27, 2011, now U.S. Pat. No. 9,049,213; Ser. No. 13/246,675, filed on Sep. 27, 2011, now U.S. Pat. No. 8,933,949; Ser. No. 13/246,665, filed on Sep. 27, 2011, now U.S. Pat. No. 9,047,102; and Ser. No. 13/246,675 filed on Sep. 27, 2011, now U.S. Pat. No. 8,933,949, the entire disclosure of each of which are hereby incorporated herein by reference.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

Current handheld computing devices may be connected to larger computer systems, e.g., personal computers (PCs), or peripheral screens to provide more display area. Current handheld devices do not include features that allow it to provide both PC functionality and the functionality associated with the handheld device, e.g., phone, text, or other communication functionality. Instead, a peripheral screen connected to a handheld device merely provides more display area for the handheld computing device. When connecting the handheld device to another computing system, such as a PC, the handheld device is typically recognized by the computing system as a peripheral device. The functionality of the handheld device is typically not integrated with the functionality of the larger computing system.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

Embodiments provide for a handheld device with a unified desktop for integrating the functionality of the handheld device with a larger computing system, e.g., a PC. When connected to a peripheral display and/or a display of a PC, the handheld device provides a unified desktop displayed across the screen(s) of the handheld device and the additional display. The unified desktop unifies the PC functionality provided on the additional display with the handheld functionality, such as communication applications (e.g., phone, SMS, MMS) provided on the screen(s) of the handheld device. A user can seamlessly interact with applications, e.g., open, drag, close, receive notifications, on the unified desktop whether the applications are displayed on the screens of the handheld device, or the peripheral display of the larger computing system. Each portion of the unified desktop (i.e., the portion on the handheld device and the portion on the peripheral screen) may display different applications, information, and/or have a different layout. Also, in embodiments, each portion of the desktop may display similar information in different formats. For example, battery level of the handheld device, wireless network signal strength, notifications, can be displayed in both portions of the desktop, with a larger format being used on the portion of the unified desktop displayed on the peripheral screen, and a smaller format used on the screen(s) of the peripheral device.

In one embodiment, a method is provided that includes displaying a desktop by at least one processor of a multi-screen device. At least a first portion of the unified desktop is displayed on a peripheral screen connected to the multi-screen device. Input is received on the unified desktop. In response to the input, a location on the unified desktop where the input was received is determined and a window of an application is opened in a portion of the unified desktop based on the location.

Another embodiment is directed to a non-transitory computer readable medium storing computer executable instructions that when executed by at least one processor perform a method. The method includes displaying a desktop by at least one processor of a multi-screen device. At least a first portion of the unified desktop is displayed on a peripheral screen connected to the multi-screen device. Input is received on the unified desktop. In response to the input, a location on the unified desktop where the input was received is determined and a window of an application is opened in a portion of the unified desktop based on the location.

Yet another embodiment is directed to a multi-screen communication device. The communication device includes a first touch sensitive display on a first screen, a second touch sensitive display on a second screen, and a computer readable medium that stores computer executable instructions that when executed by at least one processor perform a method. The method includes displaying a desktop by at least one processor of the multi-screen device. At least a first portion of the unified desktop is displayed on a peripheral screen connected to the multi-screen device and a second portion of the unified desktop is displayed on at least one screen of the multi-screen device. Input is received on the unified desktop. In response to the input, a location on the unified desktop where the input was received is determined and a window of an application is opened in a portion of the unified desktop based on the location.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composited display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application is incapable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The term "focus" refers to being active and/or selected to receive input. A screen, a display, or a component (e.g., displayed image) of a displayed graphical user interface may have "focus." Non-limiting examples of displayed images on a graphical user interface that may have "focus" include an icon of an application, an open window of an application, and/or a desktop/portion of a desktop.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6G is a seventh representation of an embodiment of a device configuration generated in response to the device state;

FIG. 6H is a eighth representation of an embodiment of a device configuration generated in response to the device state;

Figure 1A:
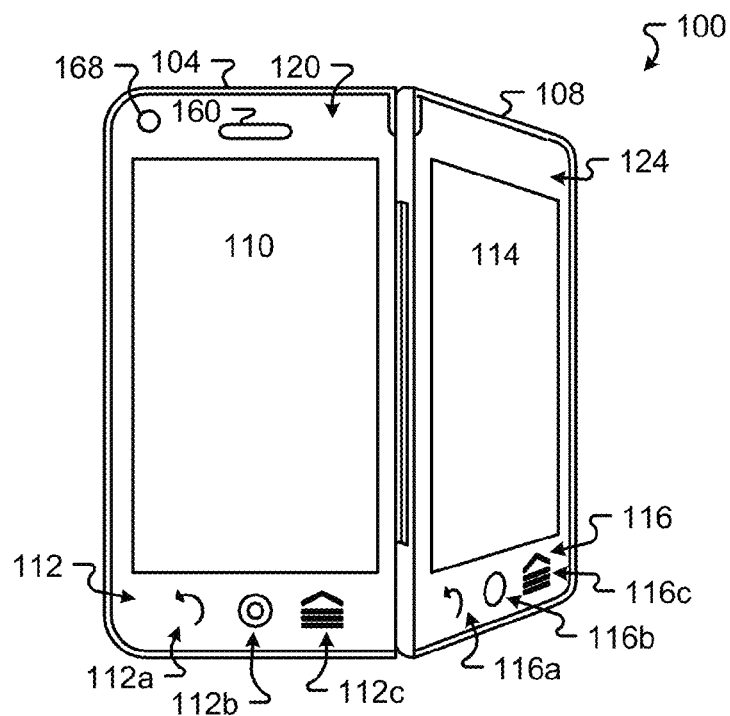
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-C and 116a-C may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
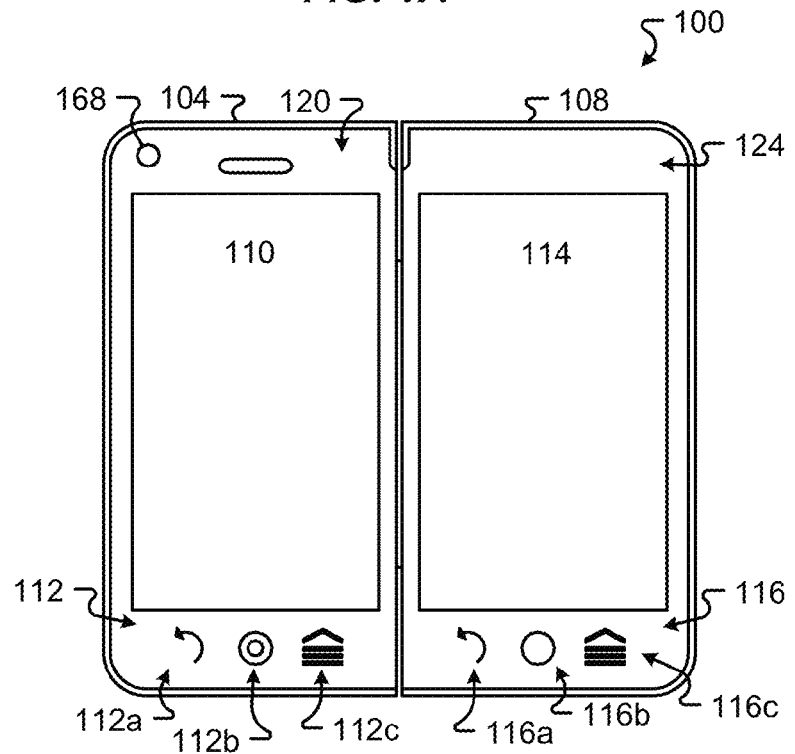
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
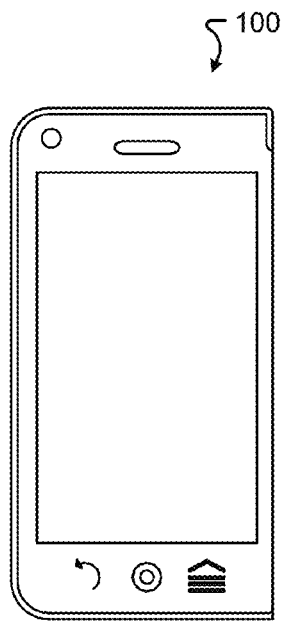
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
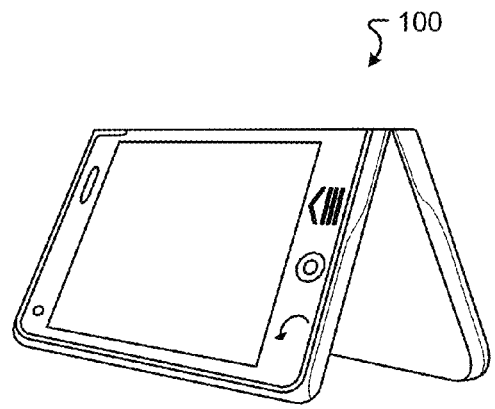
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
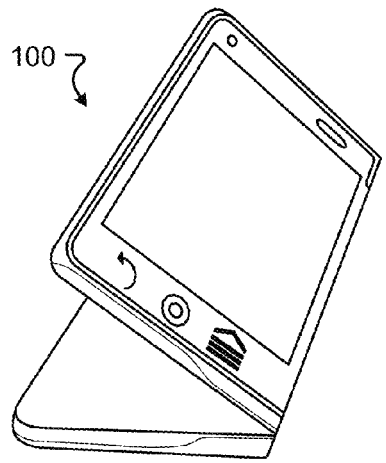
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are nonlimiting.

Figure 2:
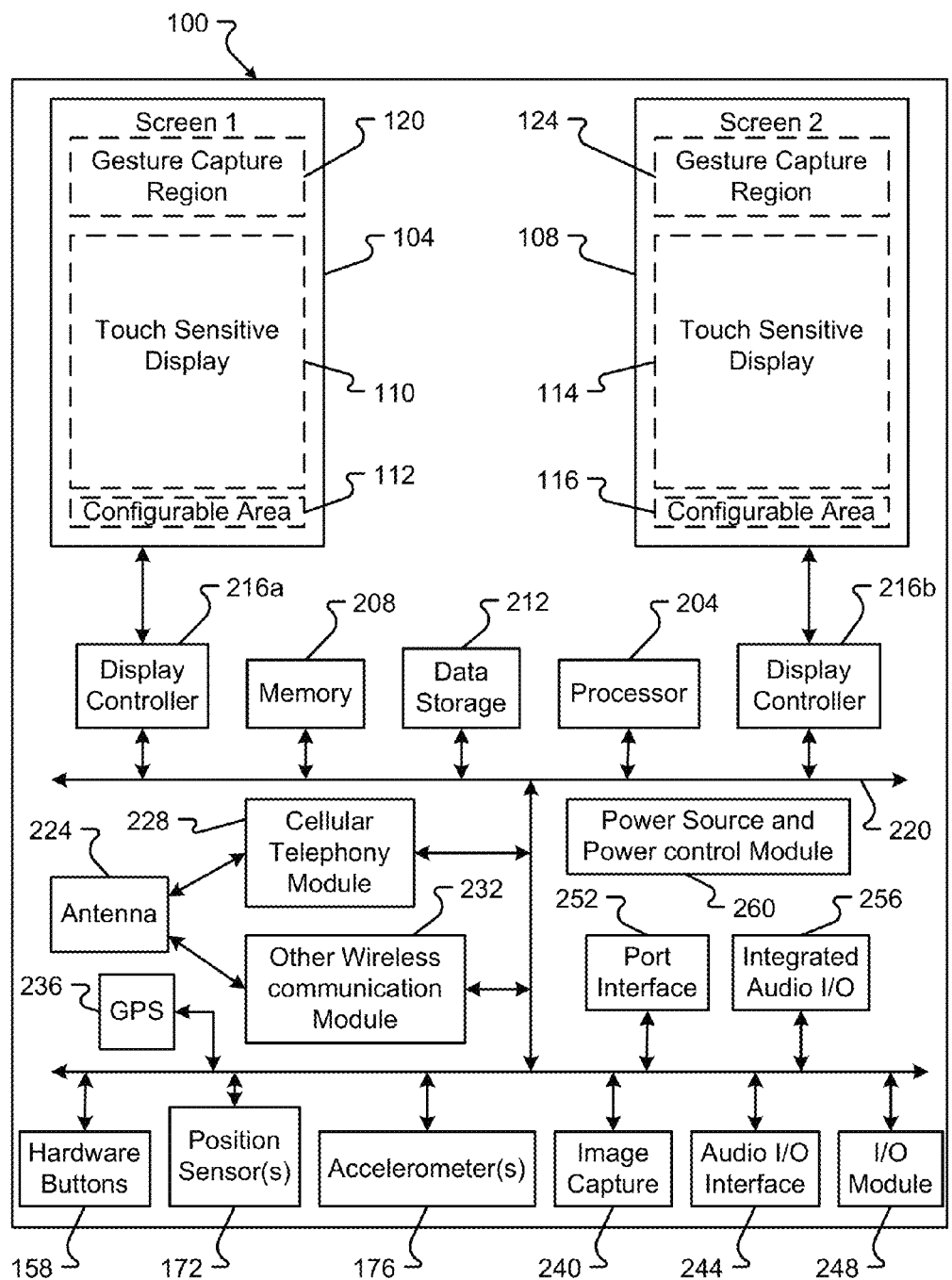
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
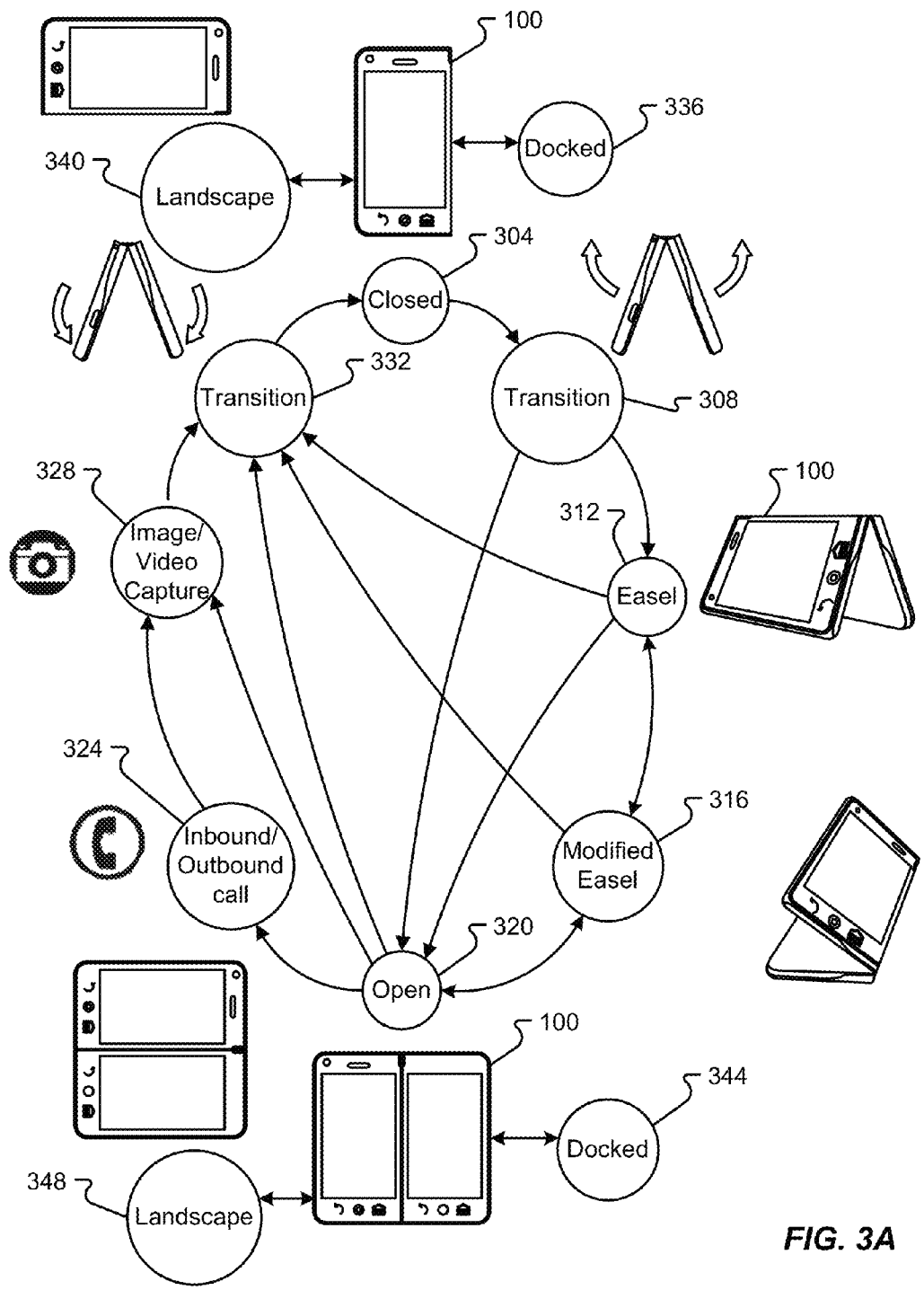
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed but the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 322 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110, 114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
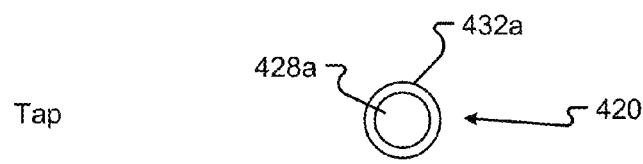
FIG. 4A is a first representation of an embodiment of user gesture received at a device.
Figure 4B:
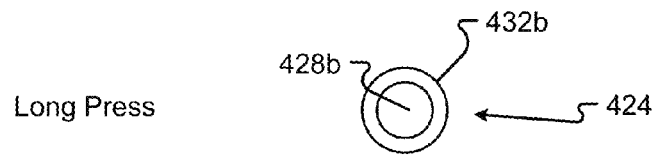
FIG. 4B is a second representation of an embodiment of user gesture received at a device.
Figure 4C:
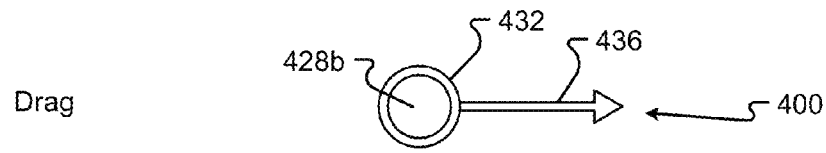
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
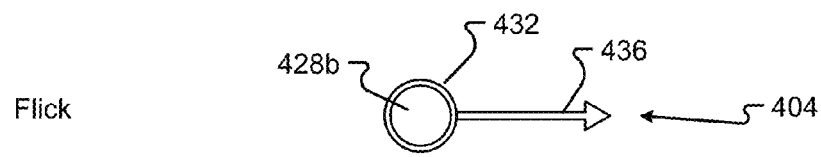
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
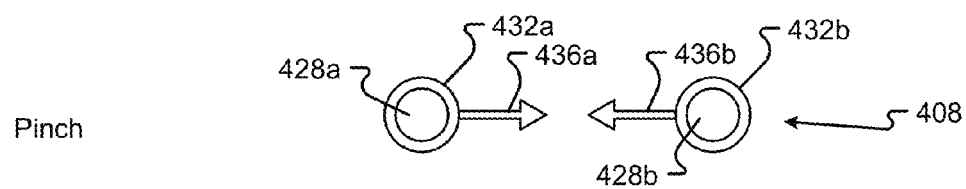
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428 to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428a, b generally occur substantially simultaneously. The first and second contacts 428a, b generally also include corresponding first and second contact movements 436a, b, respectively. The first and second contact movements 436a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
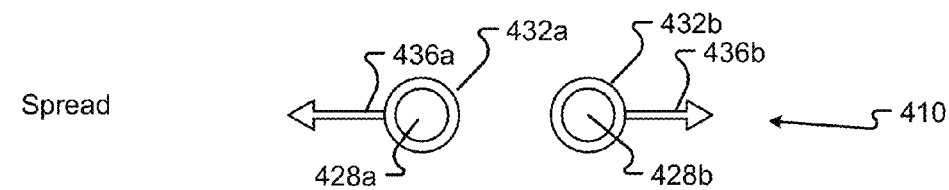
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428a, b generally occur substantially simultaneously. The first and second contacts 428a, b generally also include corresponding first and second contact movements 436a, b, respectively. The first and second contact movements 436a, b are generally in a common direction. Stated another way, the first and second contact movements 436a, b are away from the first and second contacts 428a, b. More simply stated, the spread gesture 410 may be accomplished by a user's digits touching the screen 104,108 in a spreading motion.

Figure 4G:
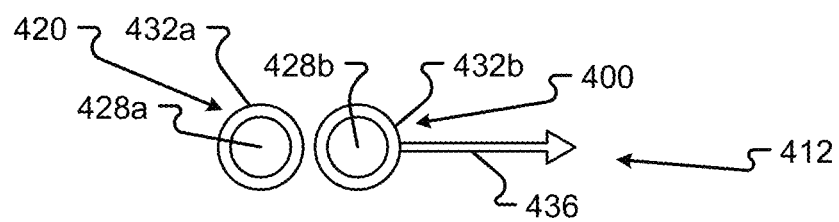
FIG. 4G is a seventh representation of an embodiment of user gesture received at a device.
Figure 4H:
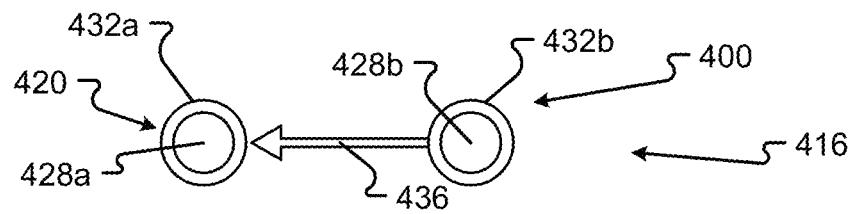
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event, which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can up-scale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110, 114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104, 108. The Display Controller 544 can direct an application's user interface to a portion of the frame buffer 548 that is mapped to a particular display 110, 114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104, 108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
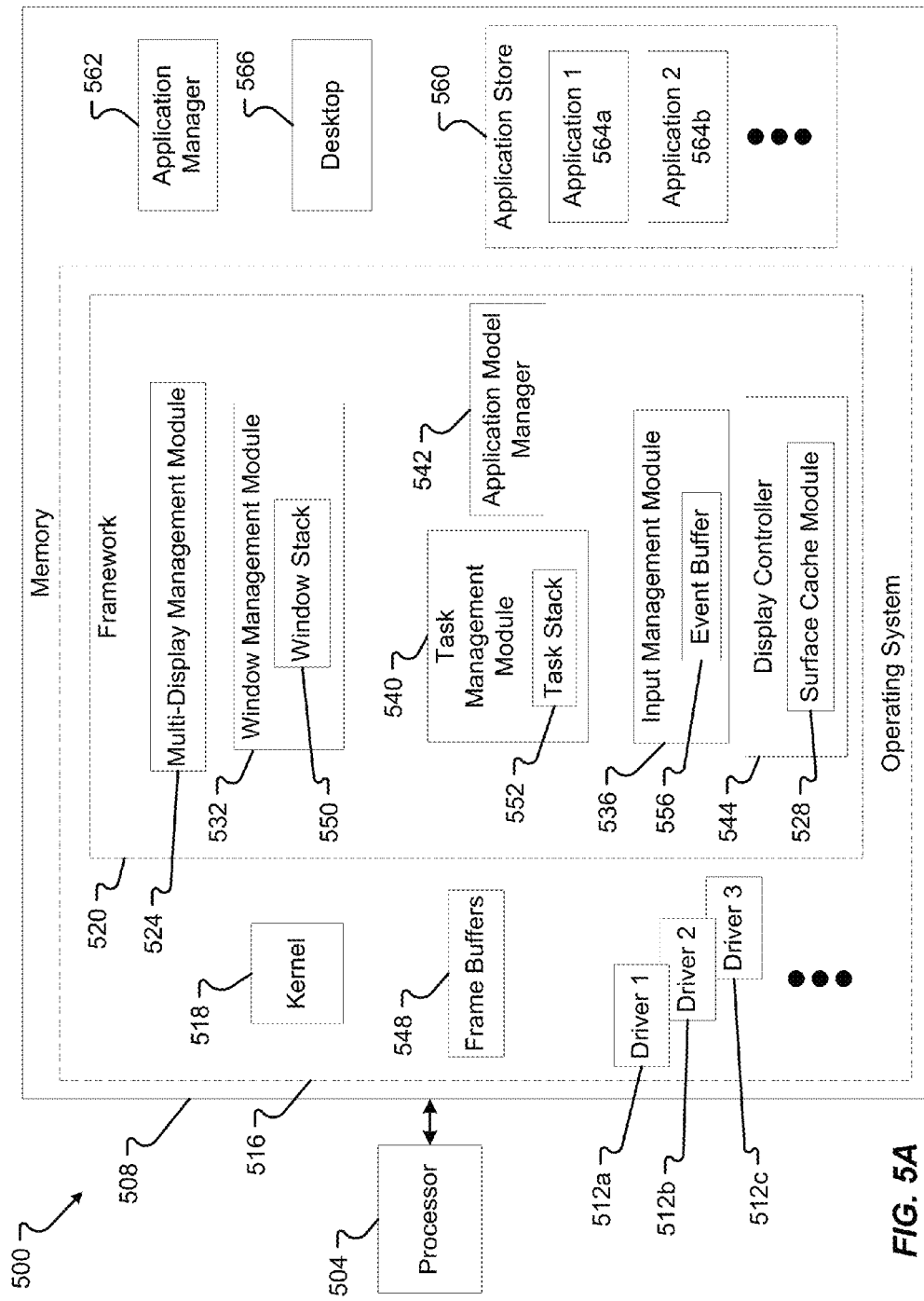
FIG. 5A is a block diagram of an embodiment of the device software and/or firmware.
Figure 5B:
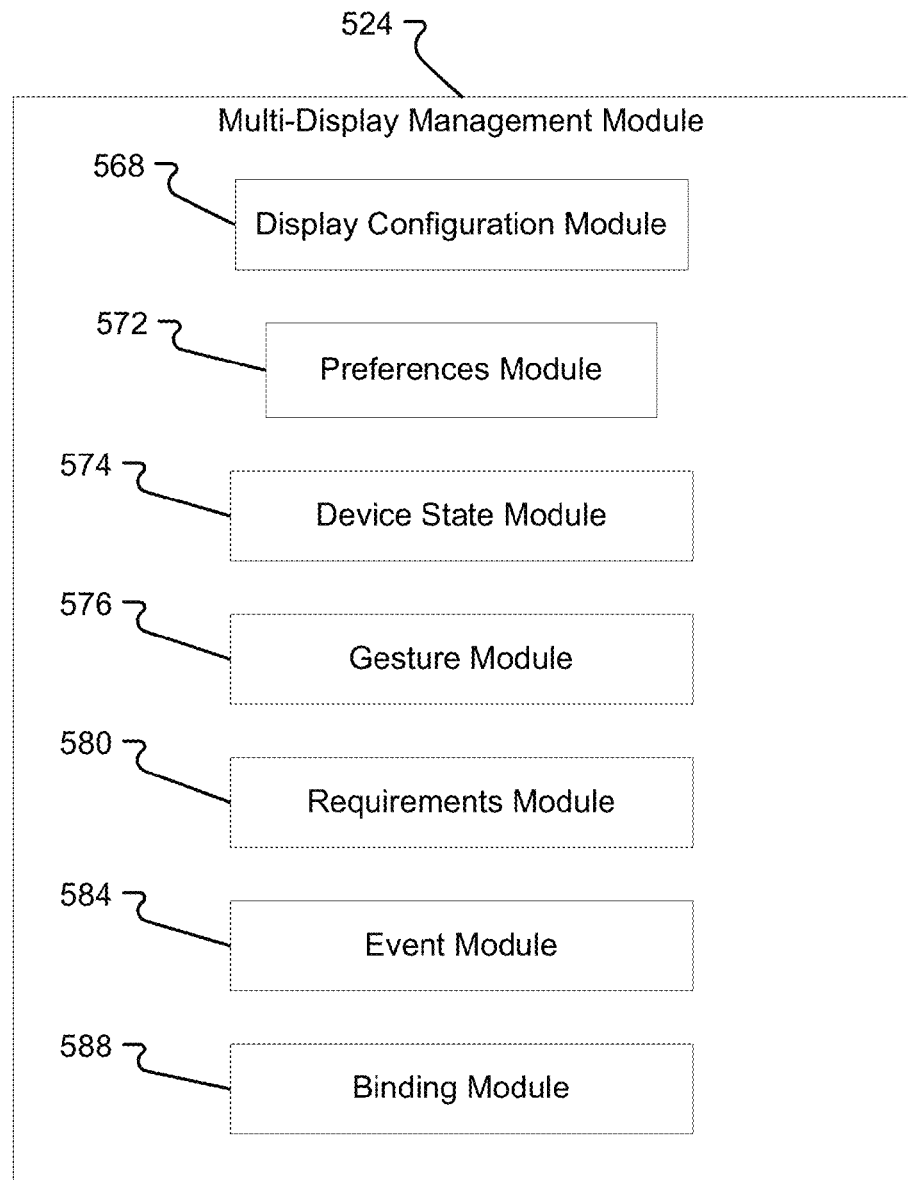
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
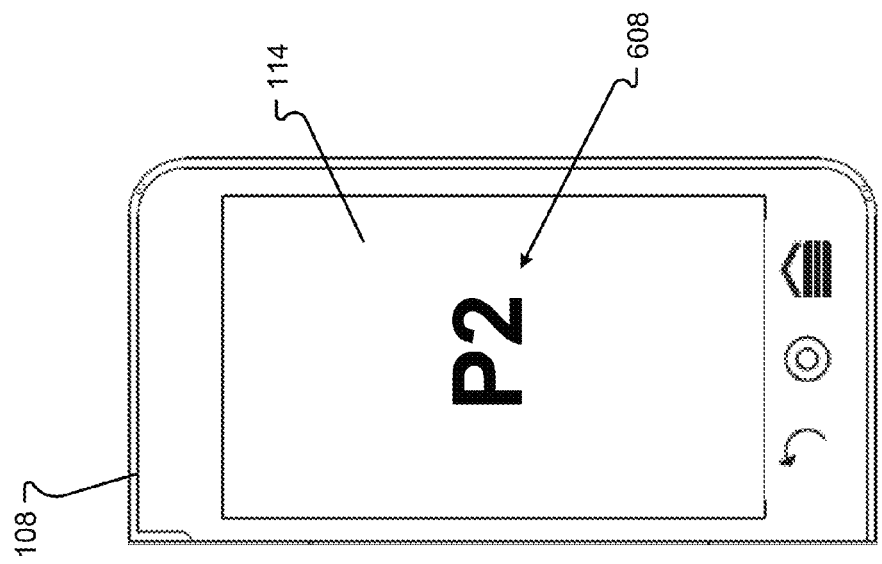
FIG. 6B is a second representation of an embodiment of a device configuration generated in response to the device state.
Figure 6A:
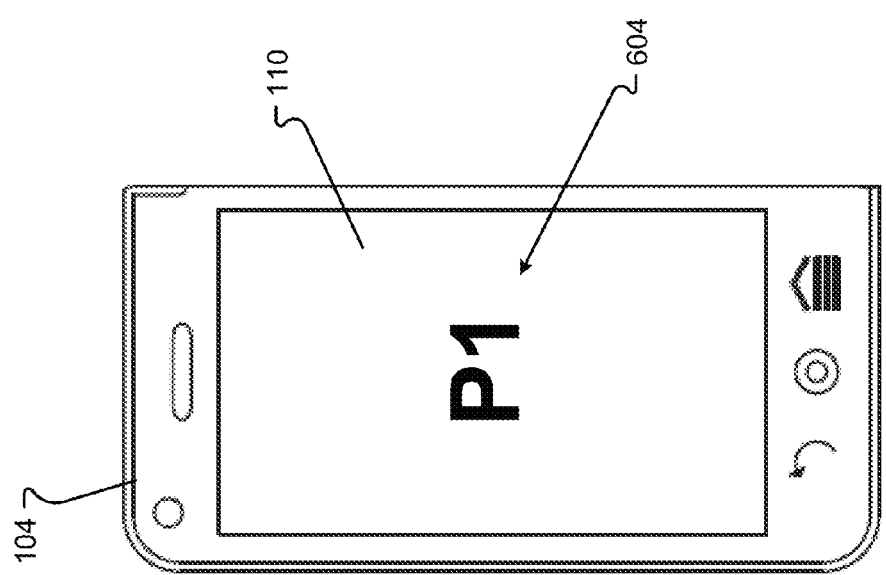
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
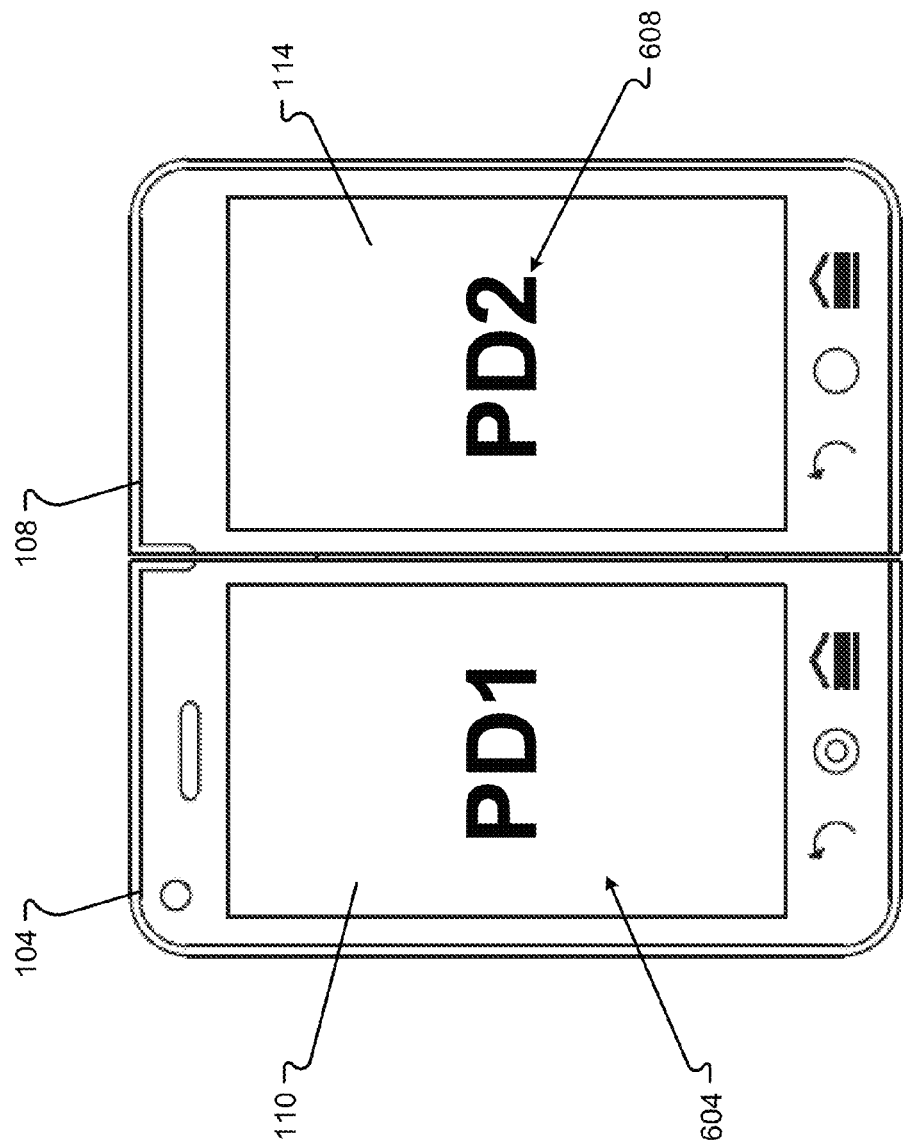
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6E:
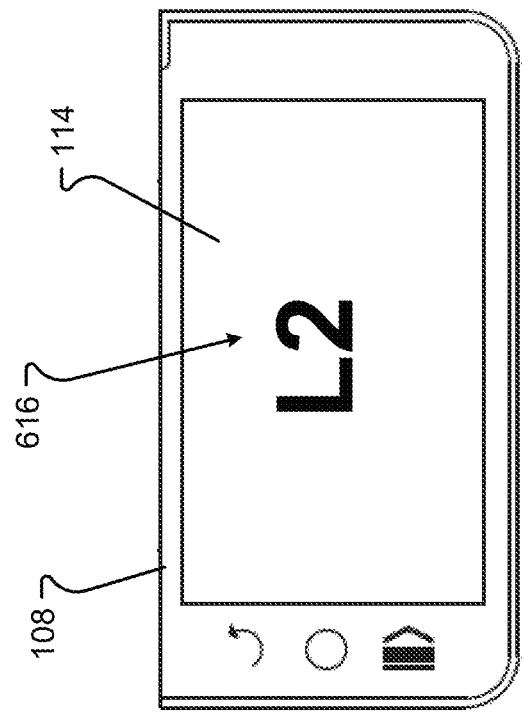
FIG. 6E is a fifth representation of an embodiment of a device configuration generated in response to the device state.
Figure 6D:
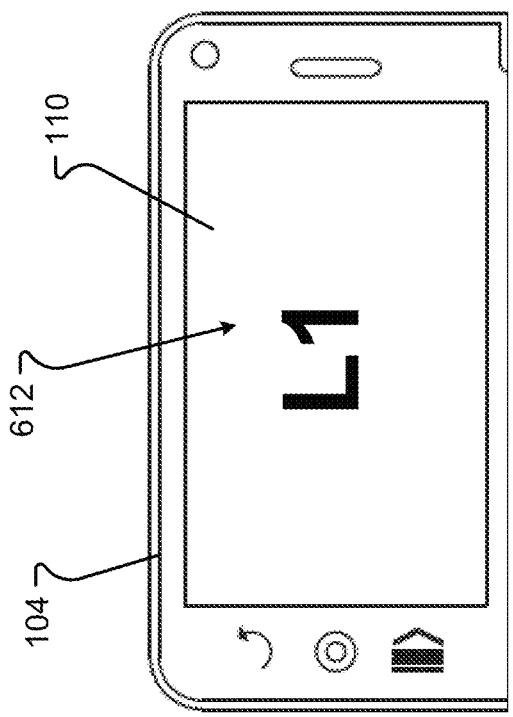
FIG. 6D is a fourth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

Figure 6F:
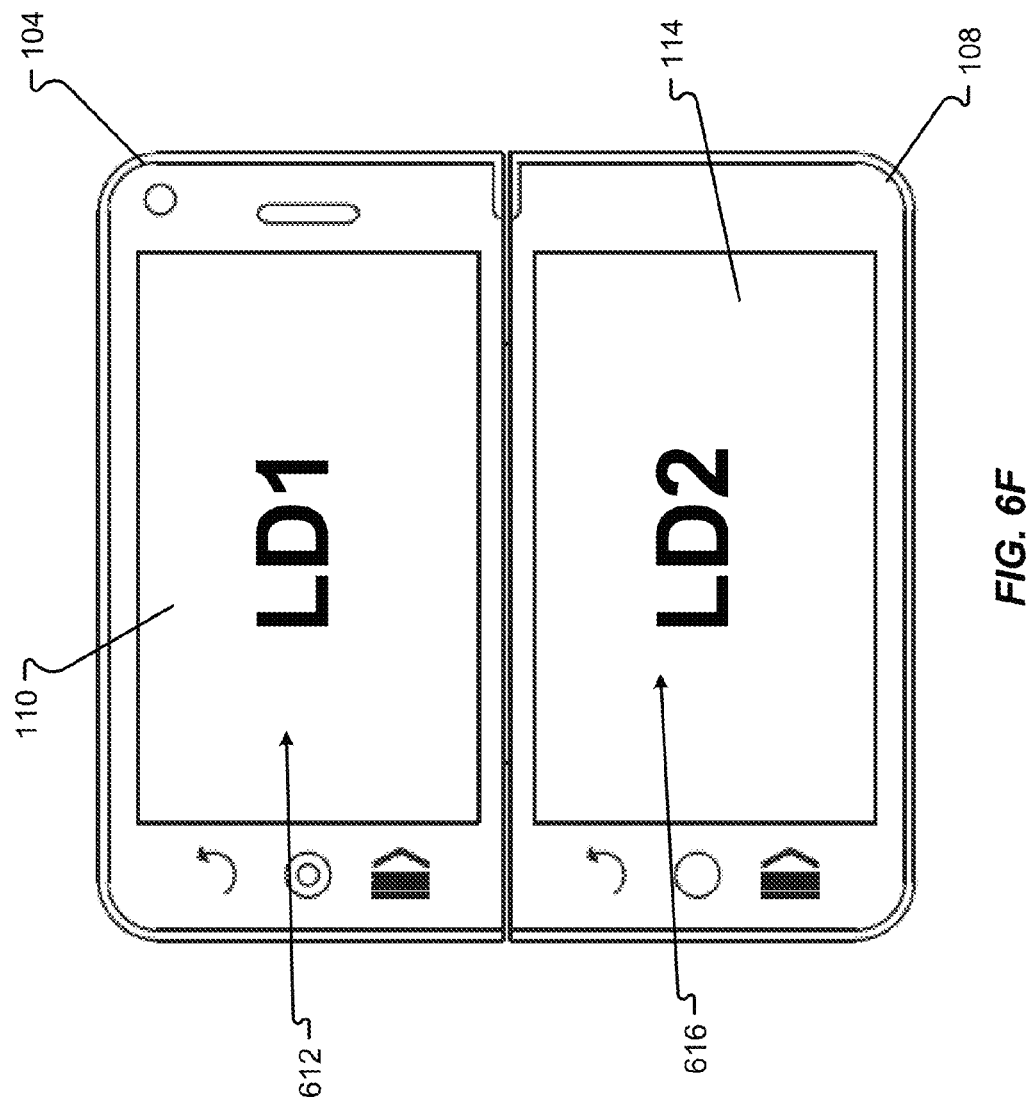
FIG. 6F is a sixth representation of an embodiment of a device configuration generated in response to the device state.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
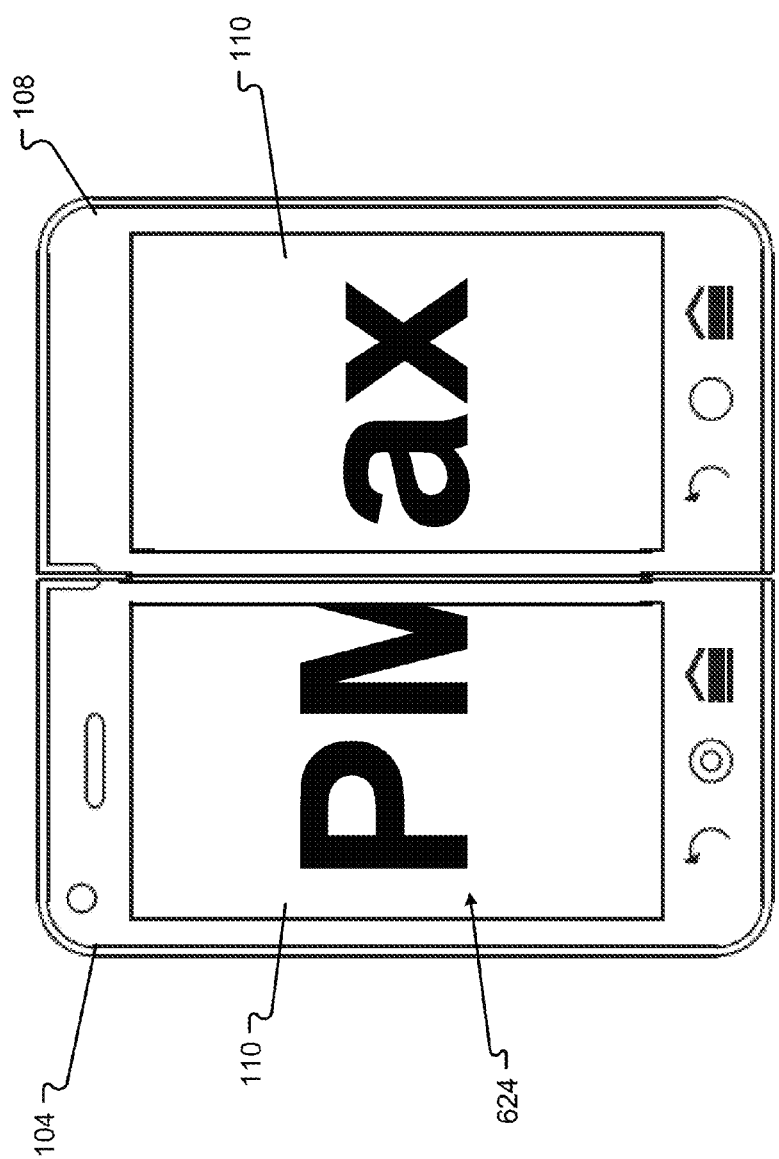
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
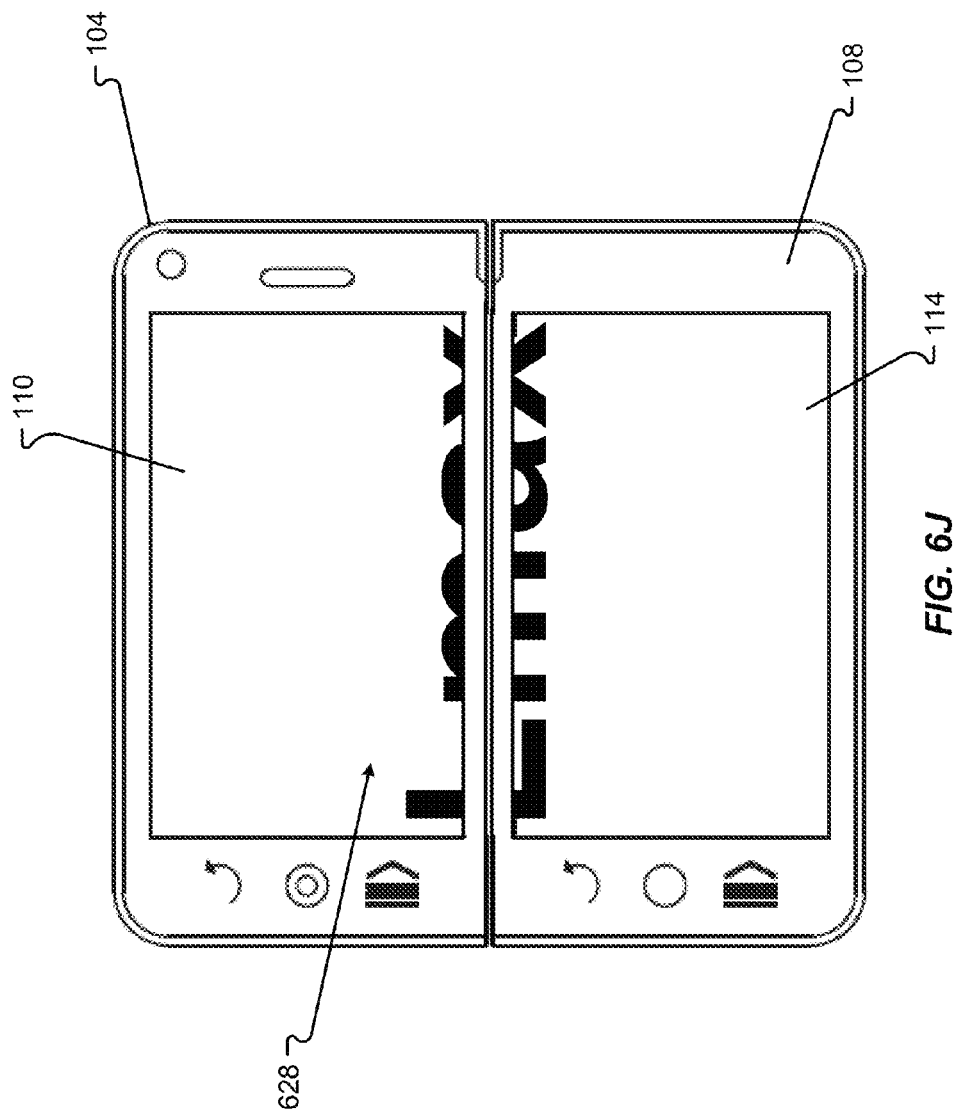
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

In embodiments, device 100 provides a unified desktop that has consistent features across different states of device 100. As noted above and illustrated in FIGS. 3A and 3B, device 100 can have numerous states including a docked state and numerous undocked states. When in the docked state, device 100 can be connected to a number of peripheral devices and provide a personal computer (PC) experience to a user.

Figure 7A:
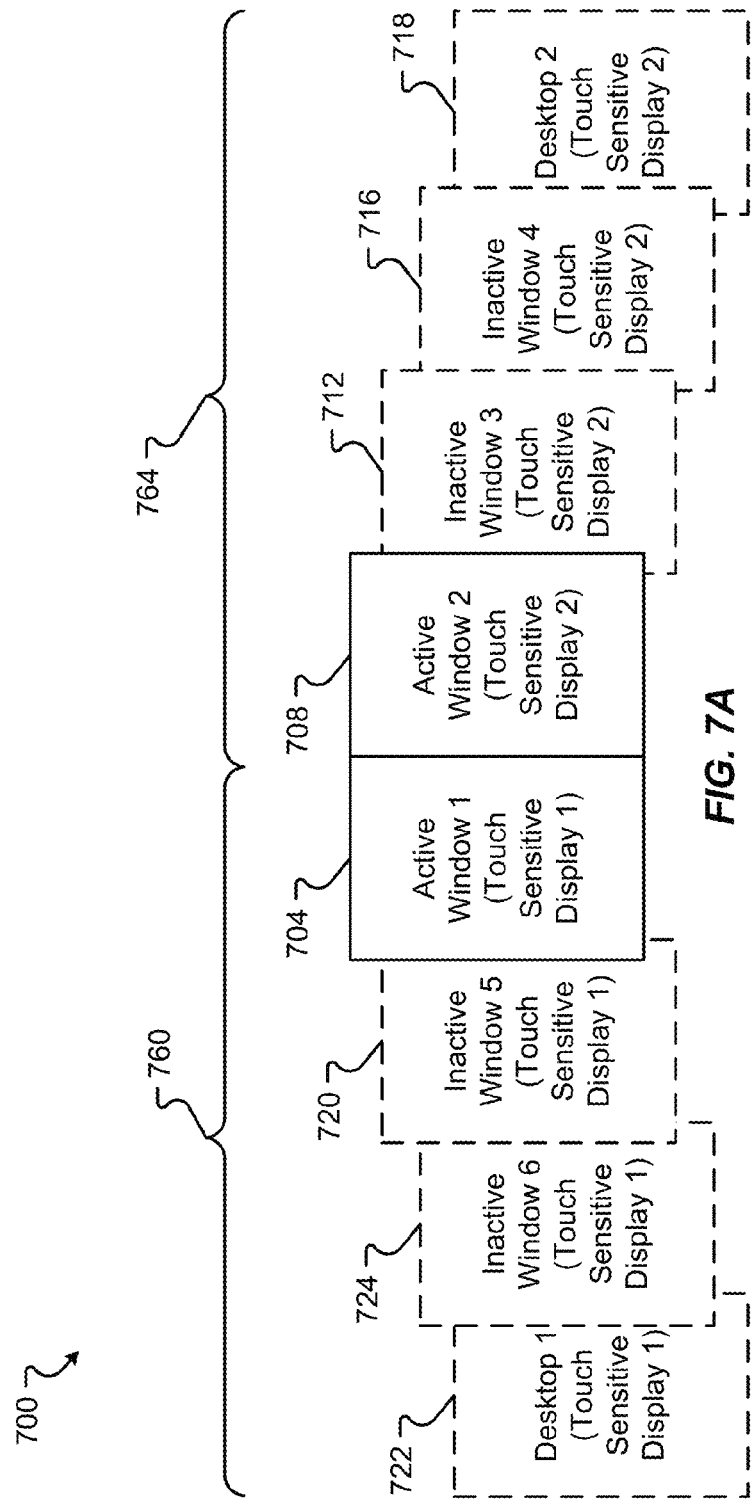
FIG. 7A is representation of a logical window stack.
Figure 7B:
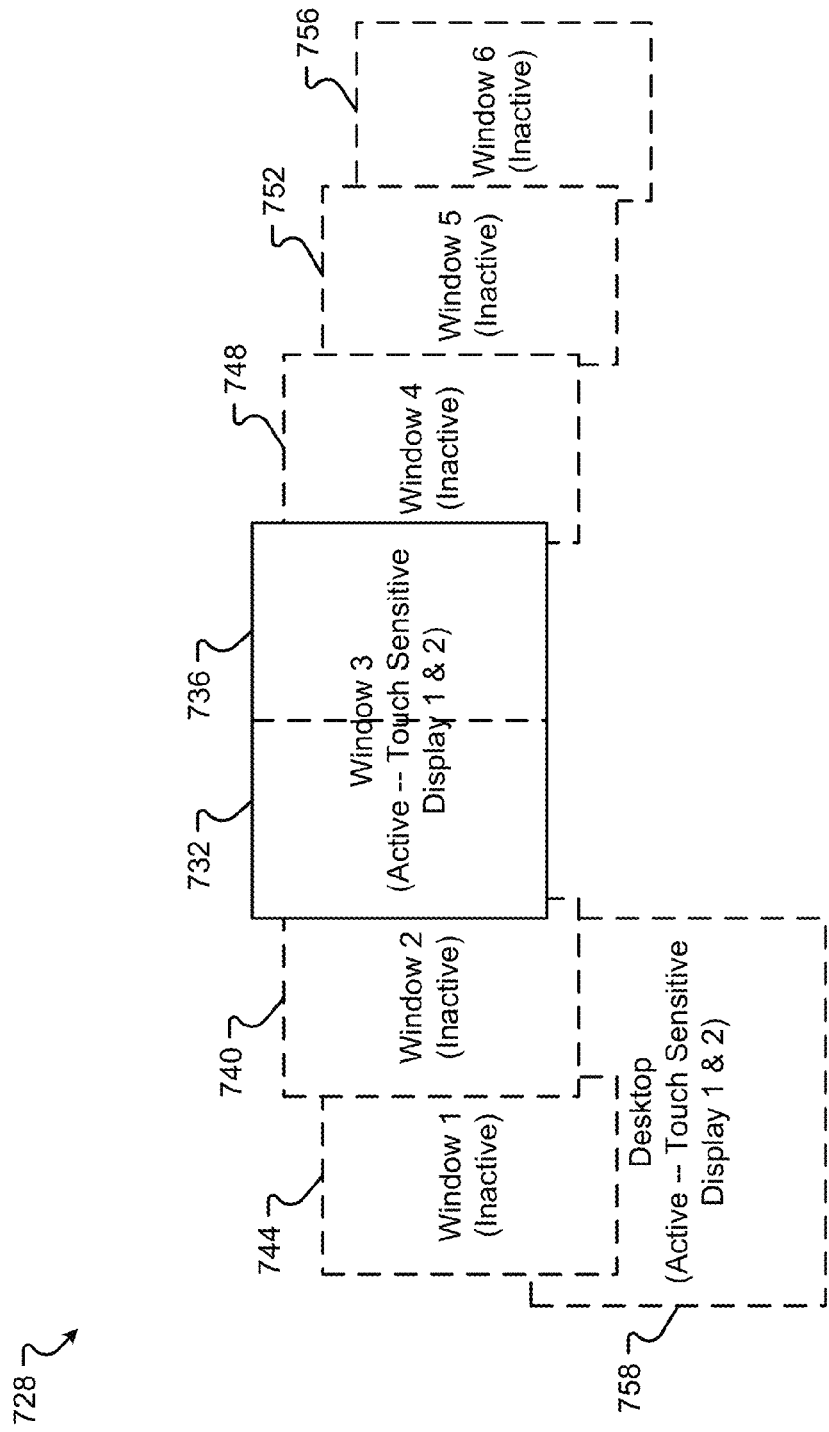
FIG. 7B is another representation of an embodiment of a logical window stack.

The device 100 manages desktops and/or windows with at least one window stack 700, 728, as shown in FIGS. 7A and 7B. A window stack 700, 728 is a logical arrangement of active and/or inactive windows for a multi-screen device. For example, the window stack 700, 728 may be logically similar to a deck of cards, where one or more windows or desktops are arranged in order, as shown in FIGS. 7A and 7B. An active window is a window that is currently being displayed on at least one of the touch sensitive displays 110, 114. For example, windows 104 and 108 are active windows and are displayed on touch sensitive displays 110 and 114. An inactive window is a window that was opened and displayed but is now "behind" an active window and not being displayed. In embodiments, an inactive window may be for an application that is suspended, and thus, the window is not displaying active content. For example, windows 712, 716, 720, and 724 are inactive windows.

A window stack 700, 728 may have various arrangements or organizational structures. In the embodiment shown in FIG. 7A, the device 100 includes a first stack 760 associated with a first touch sensitive display 110 and a second stack associated with a second touch sensitive display 114. Thus, each touch sensitive display 110, 114 can have an associated window stack 760, 764. These two window stacks 760, 764 may have different numbers of windows arranged in the respective stacks 760, 764. Further, the two window stacks 760, 764 can also be identified differently and managed separately. Thus, the first window stack 760 can be arranged in order from a first window 704 to a next window 720 to a last window 724 and finally to a desktop 722, which, in embodiments, is at the "bottom" of the window stack 760. In embodiments, the desktop 722 is not always at the "bottom" as application windows can be arranged in the window stack below the desktop 722, and the desktop 722 can be brought to the "top" of a stack over other windows during a desktop reveal Likewise, the second stack 764 can be arranged from a first window 708 to a next window 712 to a last window 716, and finally to a desktop 718, which, in embodiments, is a single desktop area, with desktop 722, under all the windows in both window stack 760 and window stack 764. A logical data structure for managing the two window stacks 760, 764 may be as described in conjunction with FIG. 8.

Another arrangement for a window stack 728 is shown in FIG. 7B. In this embodiment, there is a single window stack 728 for both touch sensitive displays 110, 114. Thus, the window stack 728 is arranged from a desktop 758 to a first window 744 to a last window 756. A window can be arranged in a position among all windows without an association to a specific touch sensitive display 110, 114. In this embodiment, a window is in the order of windows. Further, at least one window is identified as being active. For example, a single window may be rendered in two portions 732 and 736 that are displayed on the first touch sensitive screen 110 and the second touch sensitive screen 114. The single window may only occupy a single position in the window stack 728 although it is displayed on both displays 110, 114.

Figure 7C:
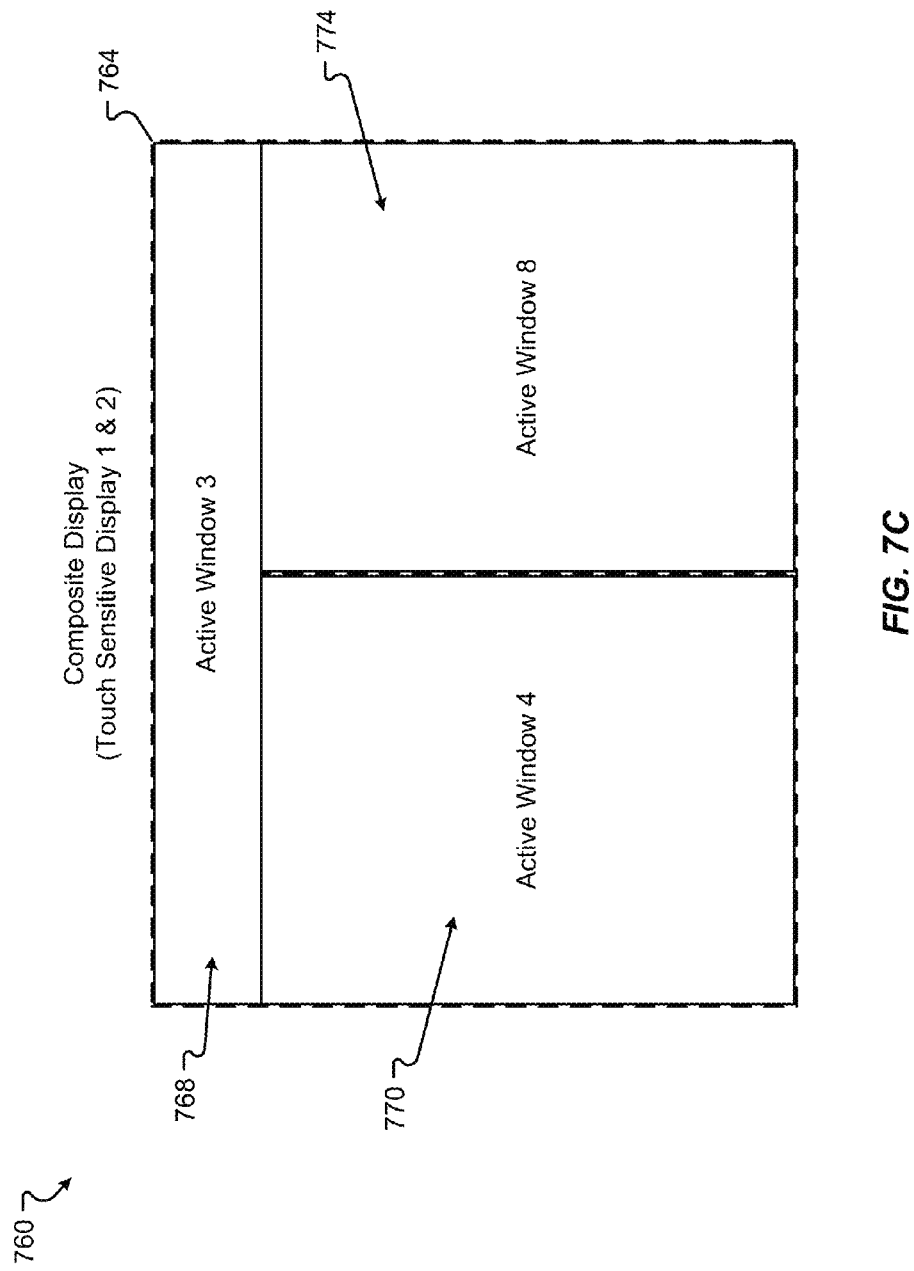
FIG. 7C is another representation of an embodiment of a logical window stack.
Figure 7D:
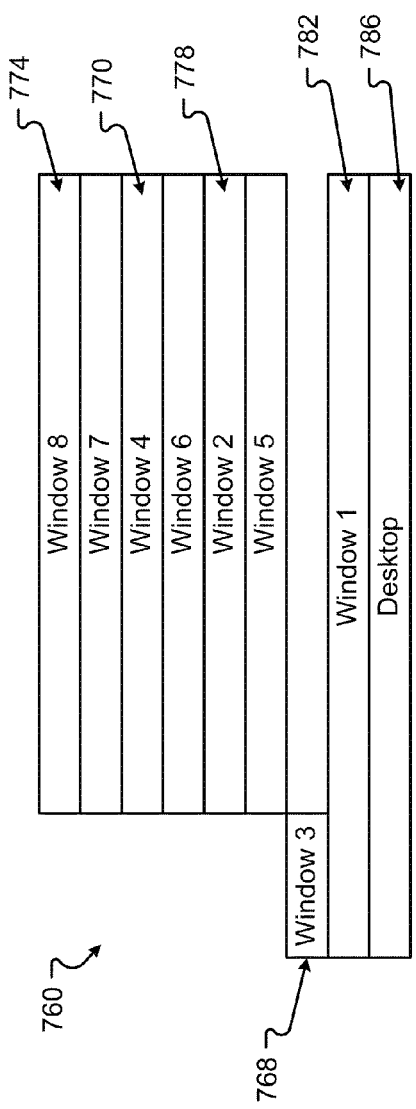
FIG. 7D is another representation of an embodiment of a logical window stack.
Figure 7E:
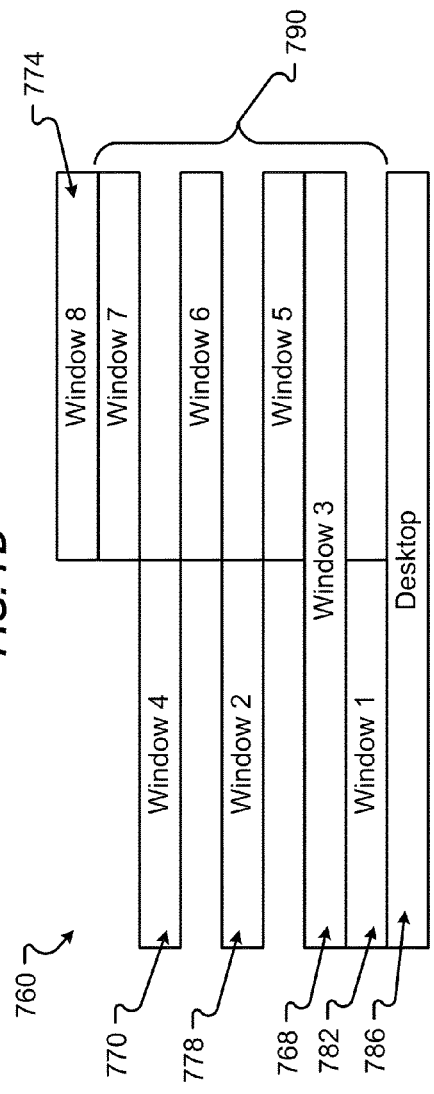
FIG. 7E is another representation of an embodiment of a logical window stack.

Yet another arrangement of a window stack 760 is shown in FIGS. 7C through 7E. The window stack 760 is shown in three "elevation" views. In FIG. 7C, the top of the window stack 760 is shown. Two sides of the window stack 760 are shown in FIGS. 7D and 7E. In this embodiment, the window stack 760 resembles a stack of bricks. The windows are stacked on each other. Looking from the top of the window stack 760 in FIG. 7C, only the top most windows in the window stack 760 are seen in different portions of the composite display 764. The composite display 764 represents a logical model for the entire display area of the device 100, which can include touch sensitive display 110 and touch sensitive display 114. A desktop 786 or a window can occupy part or all of the composite display 764.

In the embodiment shown, the desktop 786 is the lowest display or "brick" in the window stack 760. Thereupon, window 1 782, window 2 782, window 3 768, and window 4 770 are layered. Window 1 782, window 3 768, window 2 782, and window 4 770 only occupy a portion of the composite display 764. Thus, another part of the stack 760 includes window 8 774 and windows 5 through 7 shown in section 790. Only the top window in any portion of the composite display 764 is actually rendered and displayed. Thus, as shown in the top view in FIG. 7C, window 4 770, window 8 774, and window 3 768 are displayed as being at the top of the display in different portions of the window stack 760. A window can be dimensioned to occupy only a portion of the composite display 760 to "reveal" windows lower in the window stack 760. For example, window 3 768 is lower in the stack than both window 4 770 and window 8 774 but is still displayed. A logical data structure to manage the window stack can be as described in conjunction with FIG. 8.

When a new window is opened, the newly activated window is generally positioned at the top of the stack. However, where and how the window is positioned within the stack can be a function of the orientation of the device 100, the context of what programs, functions, software, etc. are being executed on the device 100, how the stack is positioned when the new window is opened, etc. To insert the window in the stack, the position in the stack for the window is determined and the touch sensitive display 110, 114 to which the window is associated may also be determined. With this information, a logical data structure for the window can be created and stored. When user interface or other events or tasks change the arrangement of windows, the window stack(s) can be changed to reflect the change in arrangement. It should be noted that these same concepts described above can be used to manage the one or more desktops for the device 100.

Figure 8:
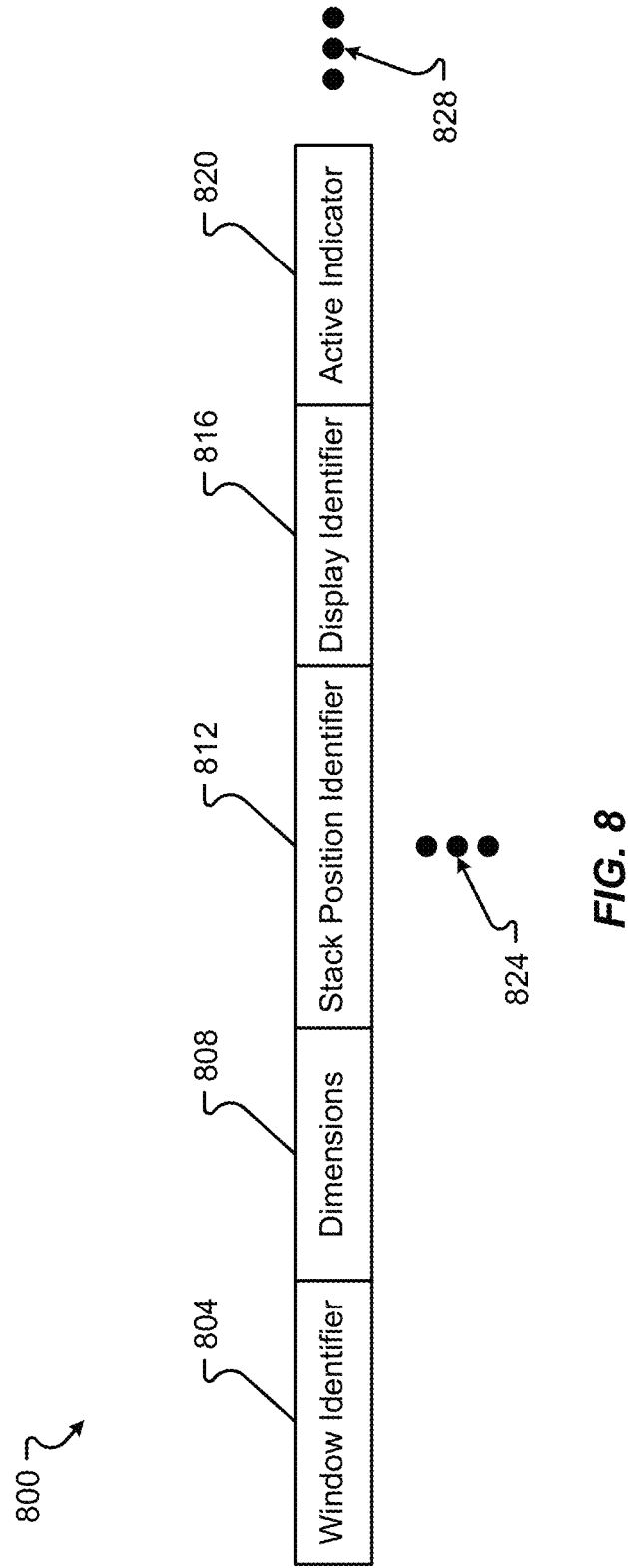
FIG. 8 is block diagram of an embodiment of a logical data structure for a window stack.

A logical data structure 800 for managing the arrangement of windows or desktops in a window stack is shown in FIG. 8. The logical data structure 800 can be any data structure used to store data whether an object, record, file, etc. The logical data structure 800 can be stored in any type of database or data storage system, regardless of protocol or standard. In embodiments, the logical data structure 800 includes one or more portions, fields, attributes, etc. that store data in a logical arrangement that allows for easy storage and retrieval of the information. Hereinafter, these one or more portions, fields, attributes, etc. shall be described simply as fields. The fields can store data for a window identifier 804, dimensions 808, a stack position identifier 812, a display identifier 816, and/or an active indicator 820. Each window in a window stack can have an associated logical data structure 800. While only a single logical data structure 800 is shown in FIG. 8, there may be more or fewer logical data structures 800 used with a window stack (based on the number of windows or desktops in the stack), as represented by ellipses 824. Further, there may be more or fewer fields than those shown in FIG. 8, as represented by ellipses 828.

A window identifier 804 can include any identifier (ID) that uniquely identifies the associated window in relation to other windows in the window stack. The window identifier 804 can be a globally unique identifier (GUID), a numeric ID, an alphanumeric ID, or other type of identifier. In embodiments, the window identifier 804 can be one, two, or any number of digits based on the number of windows that can be opened. In alternative embodiments, the size of the window identifier 804 may change based on the number of windows opened. While the window is open, the window identifier 804 may be static and remain unchanged.

Dimensions 808 can include dimensions for a window in the composite display 760. For example, the dimensions 808 can include coordinates for two or more corners of the window or may include one coordinate and dimensions for the width and height of the window. These dimensions 808 can delineate what portion of the composite display 760 the window may occupy, which may be the entire composite display 760 or only part of composite display 760. For example, window 4 770 may have dimensions 880 that indicate that the window 770 will occupy only part of the display area for composite display 760, as shown in FIGS. 7c through 7E. As windows are moved or inserted in the window stack, the dimensions 808 may change.

A stack position identifier 812 can be any identifier that can identify the position in the stack for the window or may be inferred from the window's control record within a data structure, such as a list or a stack. The stack position identifier 812 can be a GUID, a numeric ID, an alphanumeric ID, or other type of identifier. Each window or desktop can include a stack position identifier 812. For example, as shown in FIG. 7A, window 1 704 in stack 1 760 can have a stack position identifier 812 of 1 identifying that window 704 is the first window in the stack 760 and the active window. Similarly, window 6 724 can have a stack position identifier 812 of 3 representing that window 724 is the third window in the stack 760. Window 2 708 can also have a stack position identifier 812 of 1 representing that window 708 is the first window in the second stack 764. As shown in FIG. 7B, window 1 744 can have a stack position identifier 812 of 1, window 3, rendered in portions 732 and 736, can have a stack position identifier 812 of 3, and window 6 756 can have a stack position identifier 812 of 6. Thus, depending on the type of stack, the stack position identifier 812 can represent a window's location in the stack.

A display identifier 816 can identify that the window or desktop is associated with a particular display, such as the first display 110 or the second display 114, or the composite display 760 composed of both displays. While this display identifier 816 may not be needed for a multi-stack system, as shown in FIG. 7A, the display identifier 816 can indicate whether a window in the serial stack of FIG. 7B is displayed on a particular display. Thus, window 3 may have two portions 732 and 736 in FIG. 7B. The first portion 732 may have a display identifier 816 for the first display while the second portion 736 may have a display identifier 816 for the second display 114. However, in alternative embodiments, the window may have two display identifier 816 that represent that the window is displayed on both of the displays 110, 114, or a display identifier 816 identifying the composite display. In another alternate embodiment, the window may have a single display identifier 816 to represent that the window is displayed on both of the displays 110, 114.

Similar to the display identifier 816, an active indicator 820 may not be needed with the dual stack system of FIG. 7A, as the window in stack position 1 is active and displayed. In the system of FIG. 7B, the active indicator 820 can indicate which window(s) in the stack is being displayed. Thus, window 3 may have two portions 732 and 736 in FIG. 7. The first portion 732 may have an active indicator 820 while the second portion 736 may also have an active indicator 820. However, in alternative embodiments, window 3 may have a single active indicator 820. The active indicator 820 can be a simple flag or bit that represents that the window is active or displayed.

Figure 9:
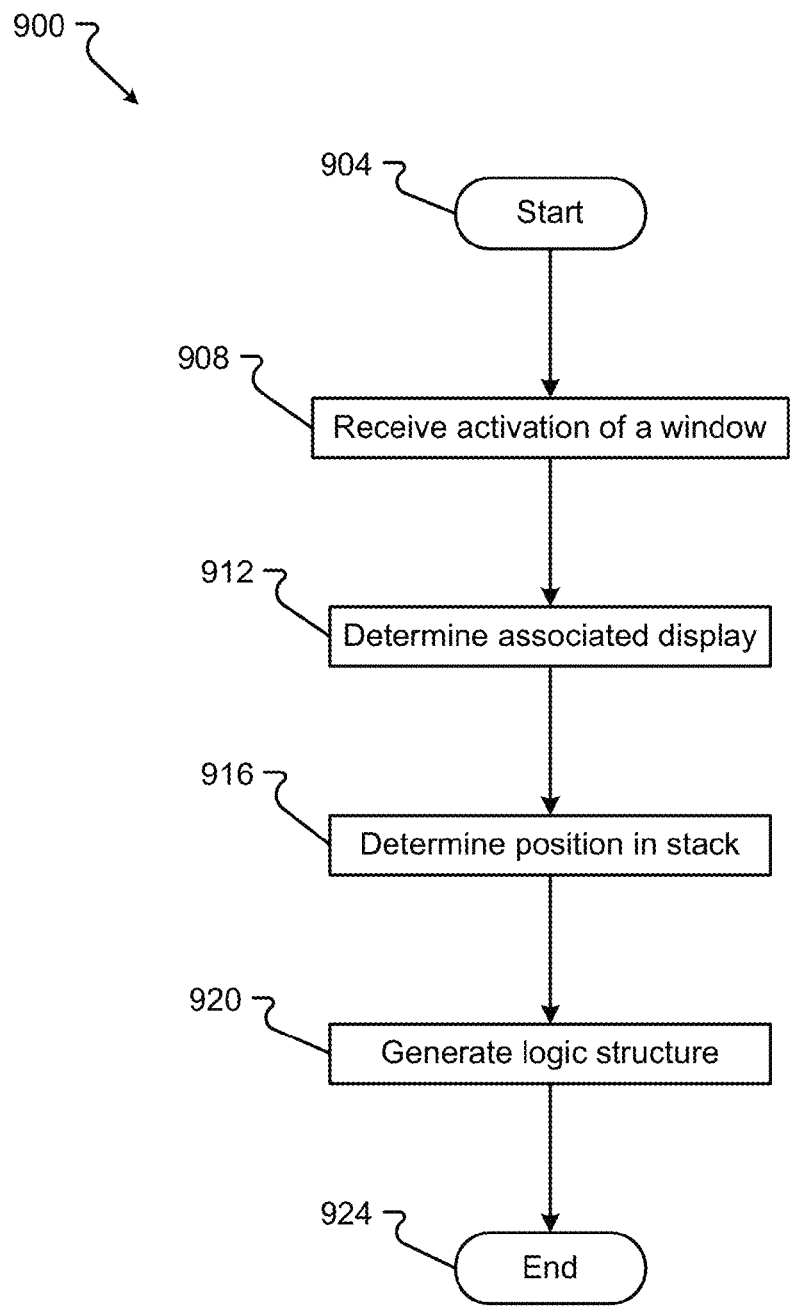
FIG. 9 is a flow chart of an embodiment of a method for creating a window stack.

An embodiment of a method 900 for creating a window stack is shown in FIG. 9. While a general order for the steps of the method 900 is shown in FIG. 9. Generally, the method 900 starts with a start operation 904 and ends with an end operation 928. The method 900 can include more or fewer steps or can arrange the order of the steps differently than those shown in FIG. 9. The method 900 can be executed as a set of computer-executable instructions executed by a computer system and encoded or stored on a computer readable medium. Hereinafter, the method 900 shall be explained with reference to the systems, components, modules, software, data structures, user interfaces, etc. described in conjunction with FIGS. 1-8.

A multi-screen device 100 can receive activation of a window, in step 908. In embodiments, the multi-screen device 100 can receive activation of a window by receiving an input from the touch sensitive display 110 or 114, the configurable area 112 or 116, a gesture capture region 120 or 124, or some other hardware sensor operable to receive user interface inputs. The processor may execute the Task Management Module 540 may receive the input. The Task Management Module 540 can interpret the input as requesting an application task to be executed that will open a window in the window stack.

In embodiments, the Task Management Module 540 places the user interface interaction in the task stack 552 to be acted upon by the Display Configuration Module 568 of the Multi-Display Management Module 524. Further, the Task Management Module 540 waits for information from the Multi-Display Management Module 524 to send instructions to the Window Management Module 532 to create the window in the window stack.

The Multi-Display Management Module 524, upon receiving instruction from the Task Management Module 540, determines to which touch portion of the composite display 760, the newly activated window should be associated, in step 912. For example, window 4 770 is associated with the a portion of the composite display 764 In embodiments, the device state module 574 of the Multi-Display Management Module 524 may determine how the device is oriented or in what state the device is in, e.g., open, closed, portrait, etc. Further, the preferences module 572 and/or requirements module 580 may determine how the window is to be displayed. The gesture module 576 may determine the user's intentions about how the window is to be opened based on the type of gesture and the location of where the gesture is made.

The Display Configuration Module 568 may use the input from these modules and evaluate the current window stack 760 to determine the best place and the best dimensions, based on a visibility algorithm, to open the window. Thus, the Display Configuration Module 568 determines the best place to put the window at the top of the window stack 760, in step 916. The visibility algorithm, in embodiments, determines for all portions of the composite display, which windows are at the top of the stack. For example, the visibility algorithm determines that window 3 768, window 4 770, and window 8 774 are at the top of the stack 760 as viewed in FIGS. 7C through 7E. Upon determining where to open the window, the Display Configuration Module 568 can assign a display identifier 816 and possibly dimensions 808 to the window. The display identifier 816 and dimensions 808 can then be sent back to the Task Management Module 540. The Task Management Module 540 may then assign the window a stack position identifier 812 indicating the windows position at the top of the window stack.

In embodiments, the Task Management Module 540 sends the window stack information and instructions to render the window to the Window Management Module 532. The Window Management Module 532 and the Task Management Module 540 can create the logical data structure 800, in step 924. Both the Task Management Module 540 and the Window Management Module 532 may create and manage copies of the window stack. These copies of the window stack can be synchronized or kept similar through communications between the Window Management Module 532 and the Task Management Module 540. Thus, the Window Management Module 532 and the Task Management Module 540, based on the information determined by the Multi-Display Management Module 524, can assign dimensions 808, a stack position identifier 812 (e.g., window 1 782, window 4 770, etc.), a display identifier 816 (e.g., touch sensitive display 1 110, touch sensitive display 2 114, composite display identifier, etc,), and an active indicator 820, which is generally always set when the window is at the "top" of the stack. The logical data structure 800 may then be stored by both the Window Management Module 532 and the Task Management Module 540. Further, the Window Management Module 532 and the Task Management Module 540 may thereinafter manage the window stack and the logical data structure(s) 800.

Figure 10:
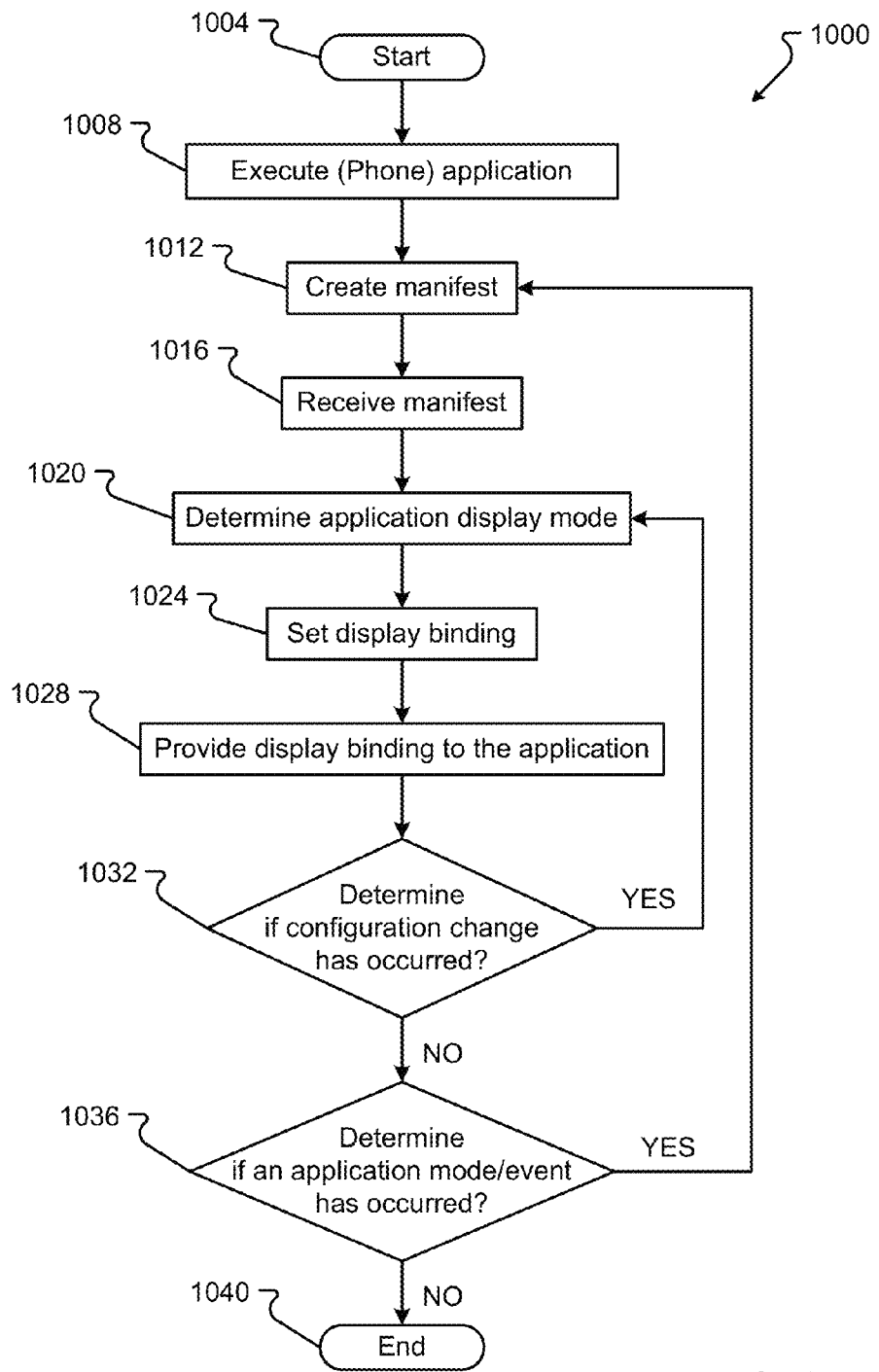
FIG. 10 is a flow chart of an embodiment of a method for managing the execution of an application.

An embodiment of a method 1000 for executing an application, such as a phone application, is shown in FIG. 10. While a general order for the steps of the method 1000 is shown in FIG. 10. Generally, the method 1000 starts with a start operation 1004 and ends with an end operation 1040. The method 1000 can include more or fewer steps or can arrange the order of the steps differently than those shown in FIG. 10. The method 1000 can be executed as a set of computer-executable instructions executed by a computer system and encoded or stored on a computer readable medium. Hereinafter, the method 1000 shall be explained with reference to the systems, components, modules, software, data structures, user interfaces, etc. described in conjunction with FIGS. 1-9.

An application, such as a phone application, is executed, in step 1008. In embodiments, a processor 204 receives indication to execute an application through a user interface 110, 114, 112, 116, etc. The indication can be a selection of an icon associated with the application. In other embodiments, the indication can be a signal generated from another application or event, such as receiving a phone call or other communication, which causes the application to execute automatically. The processor 204 can retrieve the application 564a from the application store 560 and begin its execution. In executing the application 564a, a user interface can be generated for a user.

In creating a user interface, the application 564a can begin executing to create a manifest, in step 1012. A manifest is a data structure that indicates the capabilities of the application 564a. The manifest can generally be created from the resources in the resources directory of the application 564a. The resources directory can indicate the types of modes, locations, or other indications for how the user interface should be configured in the multi-display device 100. For example, the several modes can include: "classic mode" that indicates that the application 564a is capable of being displayed on a single screen or display 110/114; "dual mode" that indicates that the application 564a is capable of being displaced on two or more displays 110 and 114; "max mode" that indicates the application 564a is capable of being displayed or desires to be displayed across multiple displays 110 and 114; and/or "bilateral mode" that indicates that the application 564a is capable of being displayed on 2 or more displays 110 and 114 when the device 100 is in easel mode (see FIGS. 1I and/or 1J).

Similarly, the manifest can include a desired or allowed location within the displays 110/114. The possible locations can include: "left", which indicates that the application 564a desires to be displayed on the left display 110; "right", which indicates that the application 564a desires to be displayed on the right display 114; and/or other indications of where a location should be including possible "top" and/or "bottom" of one or more of the displays 110/114.

The application 564a can also indicate that it desires to be displayed in a "minimum" window, which is a window that occupies less than the full area of a single display. There may be other modes possible for the application 564a, which may be included in the manifest. The manifest can be sent from the application 564a to the multi-display management module 524.

The multi-display management module 524 can receive the manifest, in step 1016. In receiving the manifest, the multi-display management module 524 can use the information to determine a display binding for the application 564a. The manifest may be received more than once from the application 564a based on changes in how the application 564a is being executed, where the application 564a desires to have a different display setting for the new mode. Thus, with the manifest, the application 564a can indicate to the multi-display management module 524 how best to or what is the desired for the application's user interface. The multi-display management module 524 can use the information in the manifest to determine the best fit for the user interface depending on how the device 100 is currently configured.

The multi-display management module 524 can determine the application display mode, in step 1020. Here the multi-display management module 524 receives or retrieves an indication of the device 100 configuration. For example, the multi-display management module 524 can determine if the device is in single display configuration (see FIG. 6A, 6B, 6D, or 6E), dual display configuration (see FIG. 6C or 6F), bilateral display configuration (see FIG. 6G or 6H), or one of the other display configurations (see FIG. 6I or 6J).

Further, the multi-display management module 524 can determine if the device 100 is in a portrait or landscape orientation. With this information, the multi-display management module 524 may then consider the capabilities or preferences listed for the application 564a in the received manifest. The combined information may then allow the multi-display management module 524 to determine a display binding. The display binding can include which of the one or more displays 110 and/or 114 are going to be used to display the application's user interface(s). For example, the multi-display management module 524 can determine that the primary display 110, the secondary display 114, or all displays 110 and 114 of the device 100 will be used to display the application's user interface.

The display modes setting can be assigned by creating or setting a number in the display binding. This number can be "0" for the primary display 110, "1" for the secondary display 114, or "2" for dual displays 110 and 114. The display mode setting can also indicate if the application 564a should display the user interface in portrait or landscape orientation. Further, there may be other settings, for example, providing a max mode or other setting that may indicate how the application 564a is to be displayed on the device. The display binding information is stored in a data structure to create and set a binding, in step 1024.

The established display binding may then be provided, by the multi-display management module 524, to the application 564a, in step 1028. The provided display binding data structure can become an attribute of the application 564a. An application 564a may thereinafter store the display binding attribute in the memory of the device 100. The application 564a with the display binding may then generate a user interface based on this display binding. The application 564a may be unaware of the position of the display 110/114 but may be able to determine, from the display binding, the size of the available user interface to generate a window that has particular characteristics for that display setting.

When a configuration change happens to the device 100, the multi-display management module 524 may change the display binding and send a new display binding to the application 564a. In embodiments, the multi-display management module 524 may indicate to the application 564a that there is a new binding or, in other embodiments, the application 564a may request a display configuration change or a new display binding, in which case the multi-display management module 524 may send a new display binding to the application 564*a*. Thus, the multi-display management module 524 can change the configuration of the display for the application 564*a* by altering the display binding for the application 564*a* during the execution of that application 564*a*.

The multi-display management module 524 thereinafter, while the application 564*a* is executing, can determine if there has been a configuration change to the device 100, in step 1032. The configuration change may be an event (see FIGS. 3A and 3B) triggered by one or more signals from one or more hardware sensor 172, 176, etc. For example, if the device 100 is changed from portrait 304 to landscape 340 orientation, Hall effect sensors 172 may indicate to the framework 520 that a display configuration change has been made. Other changes may include transitions from a single display 304 to a dual display configuration 320, by opening the device. Other types of configuration changes may be possible and may be signaled to alert the multi-display management module 524 of the configuration change. If a configuration change has been made, the method 1000 proceeds YES to step 1020 so that the multi-display management module 524 can determine new application display mode settings and create a new display binding, which may be passed to the application 564*a*. If there are no configuration changes, the method 1000 precedes NO to step 1036.

In step 1036, a new application mode change may be determined. Application mode changes can also occur in the application 564*a*, and thus, the application 564*a* can determine if something has occurred within the application 564*a* that requires a different display setting. Modes are described hereinafter with respect to FIG. 51. The mode change can create a desire to change the display 110/114, and thus, require the application 564*a* to generate a new manifest. If the application 564*a* does sense a mode change or an event has occurred that requires a change in display setting, the method 1000 proceeds YES back to step 1012. At step 1012, a new manifest or preference is created by the application 564*a* that may be received by the multi-display management module 524 to determine if the multi-display management module 524 can change the display binding. If it is possible to provide the preferred display, the multi-display management module 524 can create a new display binding and send display binding back to the application 564*a* and allow the application 564*a* to alter its user interface. If no mode change is sensed or an event is not received to create a mode change, the method 1000 proceeds NO to end operation 1040.

Figure 11:
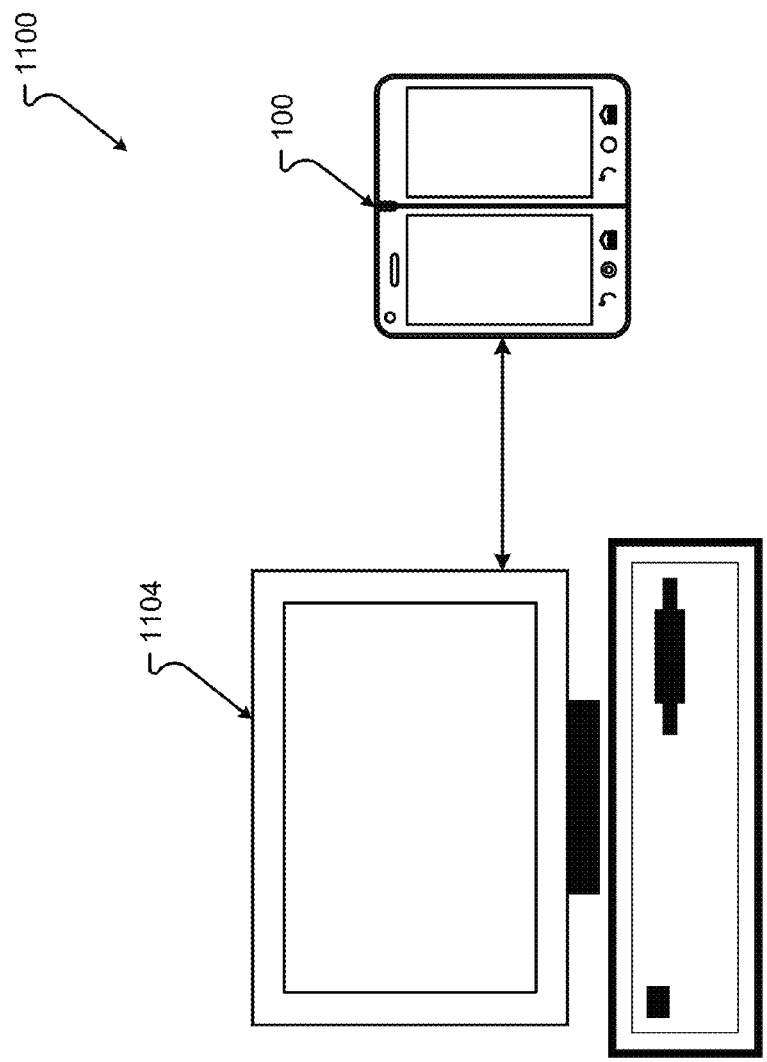
FIG. 11 is a block diagram of an embodiment of the hardware of a unified system.

Unified System:

An embodiment of a unified system 1100 is shown in FIG. 11. In embodiments, the unified system 1100 includes a computer system 1104 and the device 100. The computer system 1104 may be as described in conjunction with FIG. 12 below. In other embodiments, the computer system 1104 may merely be a peripheral display and not have additional processing means. The device 100 may be as described herein in conjunction with FIG. 1A through FIG. 10. The device 100 may be physically connected to the computer system 1104 with a docking cradle or other wired connection. In other embodiments, the device 100 and computer system 1104 may communicate wirelessly using a wireless system and/or protocol (e.g., Bluetooth™, 802.11g, etc.). The unified system 1100 functions as to allow the device 100 to communicate with, interact with, and/or control the function of the computer system 1104. As such, when executed, the unified system appears to be a single system where the device 100 and the computer system 1104 function in concert. The components and/or software that enable the unified system, the communications or functions of the unified system, and other description of the unified system is described in U.S. Provisional Applications 61/507,206, 61/507,201, 61/507,199, 61/507,209, 61/507,203, and 61/389,117, which are each incorporated herein, by reference, for all that they teach and for all purposes. Further, the unified system is also described in U.S. patent application Ser. Nos. 12/948,585 and 12/948,676, which are each incorporated herein, by reference, for all that they teach and for all purposes.

Figure 12:
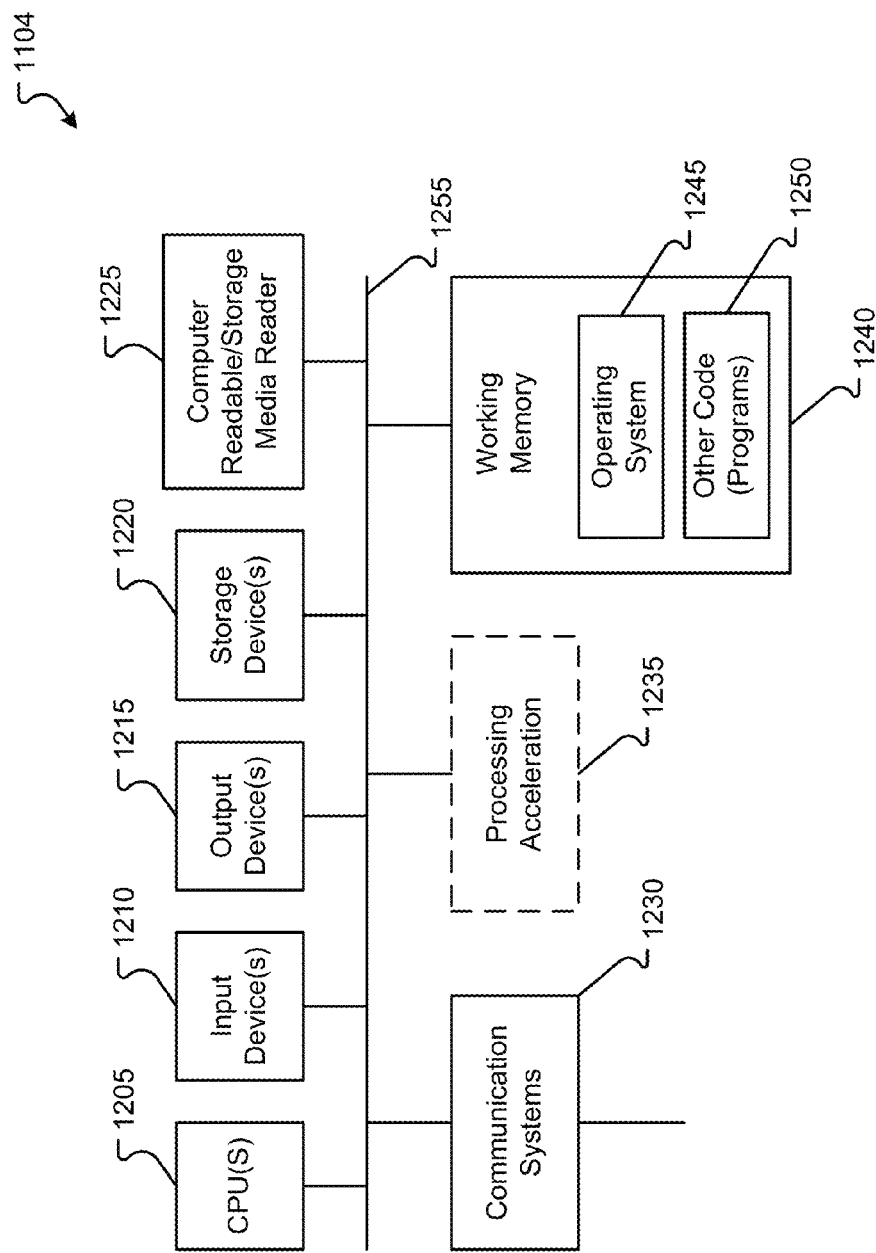
FIG. 12 is a block diagram of an embodiment of the hardware of a computer system.

FIG. 12 illustrates one embodiment of a computer system 1104. The computer system 1104 is shown comprising hardware elements that may be electrically coupled via a bus 1255. The hardware elements may include one or more central processing units (CPUs) 1205; one or more input devices 1210 (e.g., a mouse, a keyboard, etc.); and one or more output devices 1215 (e.g., a peripheral display device, a printer, etc.). The computer system 1104 may also include one or more storage devices 1220. By way of example, storage device(s) 1220 may be disk drives, optical storage devices, solid-state storage devices, such as a random access memory ("RAM") and/or a read-only memory ("ROM"), which can be programmable, flash-updateable, and/or the like.

The computer system 1104 may additionally include a computer-readable storage media reader 1225; a communications system 1230 (e.g., a modem, a network card (wireless or wired), an infra-red communication device, etc.); and working memory 1240, which may include RAM and ROM devices as described above. In some embodiments, the computer system 1104 may also include a processing acceleration unit 1235, which can include a DSP, a special-purpose processor and/or the like The computer-readable storage media reader 1225 can further be connected to a computer-readable storage medium, together (and, optionally, in combination with storage device(s) 1220) comprehensively representing remote, local, fixed, and/or removable storage devices plus storage media for temporarily and/or more permanently containing computer-readable information. The communications system 1230 may permit data to be exchanged with the network 1220 and/or any other computer described above with respect to the system 1104. Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices, and/or other machine readable mediums for storing information.

The computer system 1104 may also comprise software elements, shown as being currently located within a working memory 1240, including an operating system 1245 and/or other code 1250, such as program code implementing the components and software described herein. It should be appreciated that alternate embodiments of a computer system 1104 may have numerous variations from that described above. For example, customized hardware might also be used and/or particular elements might be implemented in hardware, software (including portable software, such as applets), or both. Further, connection to other computing devices such as network input/output devices may be employed.

Figure 13:
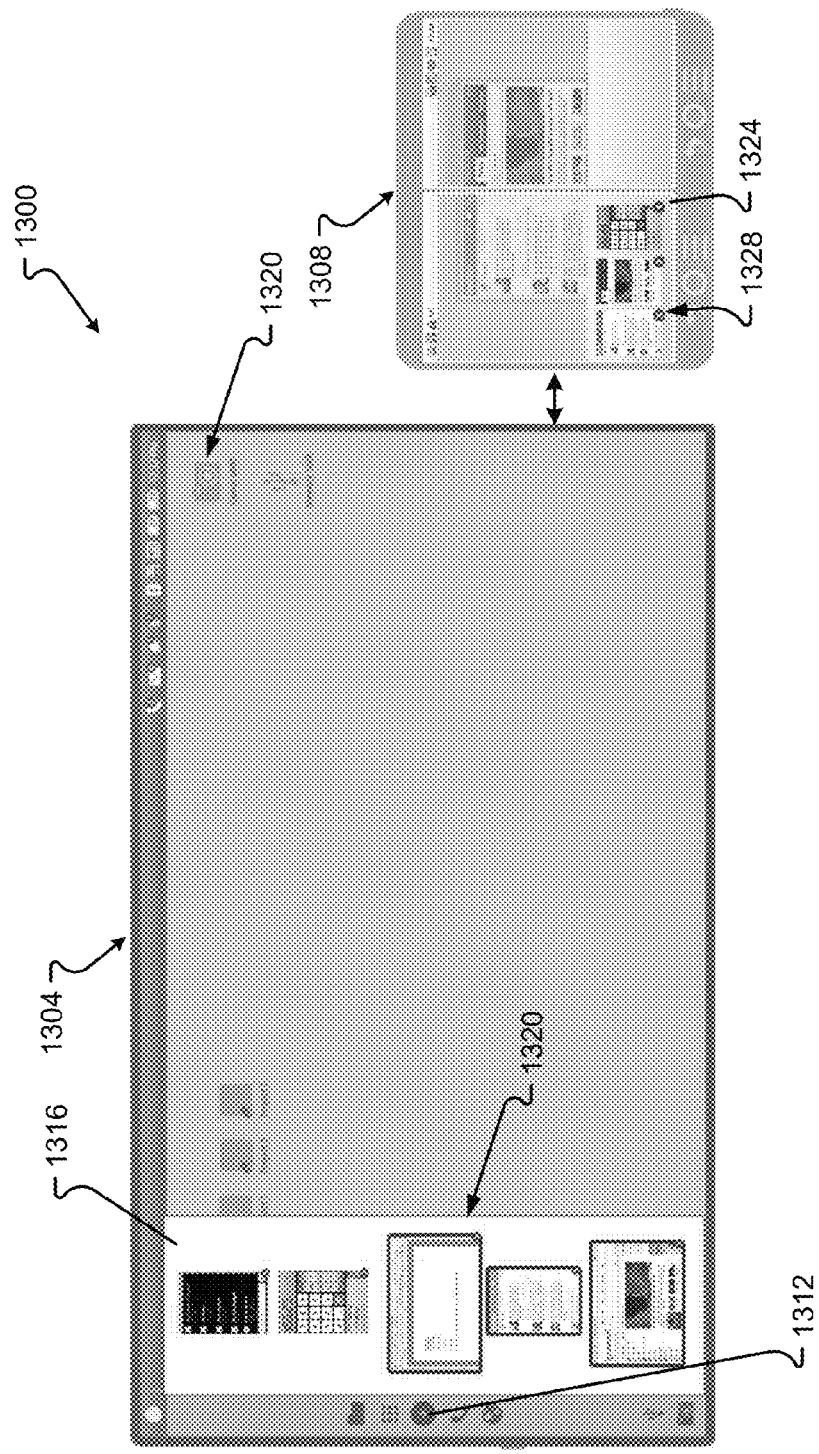
FIG. 13 is a representation of an embodiment of a unified desktop.

Unified Desktop:

An embodiment of a unified desktop 1300 is shown in FIG. 13. The unified desktop 1300 is the user interface for the unified system 1100 (FIG. 11). Thus, the unified desktop 1300 is formed from a first portion, namely the user interface 1304 of the computer system 1104 and a second portion, namely the user interface 1308 of the device 100. As a unified desktop 1300, the user interface 1304 and 1308 function together to provide parallel displays, exchange windows or other user interface elements, and generally present a cohesive user interface across both the computers system 1104 and the device 100. The device 100 can assume the form factor and function of both device 100 and the computer system 1104; the design of the unified desktop can provide a seamless user experience across the device 100 and the computer system 1104, enabling the user to access shared content, manage applications and peripherals regardless of which system 100 or 1104 presents the user interface action. Hereinafter, specific user interface actions related to the unified desktop shall be presented.

FIG. 13 additionally illustrates an application manager, which is a feature of some embodiments. An indication 1312 of the application manager is displayed on the first portion 1304 of the unified desktop 1300. The indication 1312 is in embodiments an icon that may be used to receive input requesting that a window 1316 of the application manager be displayed, e.g., may be clicked by a user. In some embodiments, the indication 1312 provides information regarding the applications that are open on unified desktop 1300. For example, indication 1312 may be an icon that includes a number of applications that are currently open. Indication 1312 may provide additional information in other embodiments.

In the embodiment shown in FIG. 13, a mouse pointer is hovered over indication 1312. In response to the input, window 1316 is displayed showing a plurality of indications 1320. The indications 1320 represent windows of applications that are currently open on one of the first portion 1304 of unified desktop 1300 and/or the second portion 1308 of the unified desktop 1300.

Similarly, a second indication (not shown) of the application manager may be displayed on the second portion 1308 of the unified desktop 1300. The second indication is in embodiments also an icon that may be used to receive input requesting that a second window 1324 of the application manager be displayed, e.g., may be clicked by a user. In response to input entered using the second indication of the application manager, window 1324 is displayed showing a plurality of indications 1328. The indications 1328 represent windows of applications that are currently open on one of the first portion 1304 of unified desktop 1300 and/or the second portion 1308 of the unified desktop 1300. Associated, in embodiments the indications 1328 are the same as the indications 1320. In embodiments, the indications 1320 and 1328 are merely smaller versions of windows of open applications.

Figure 14:
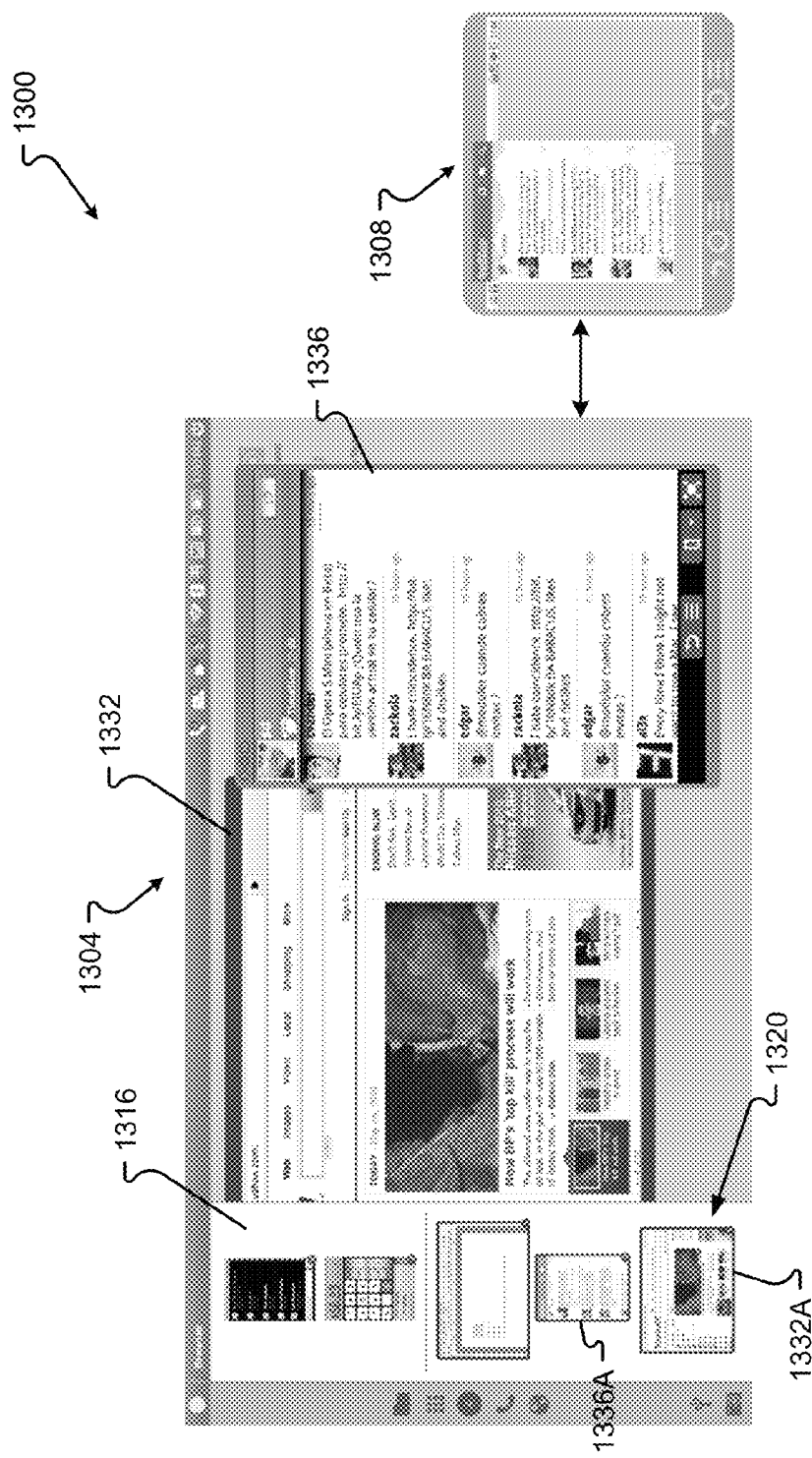
FIG. 14 is a representation of the unified desktop of FIG. 13 in freeform mode.
Figure 15:
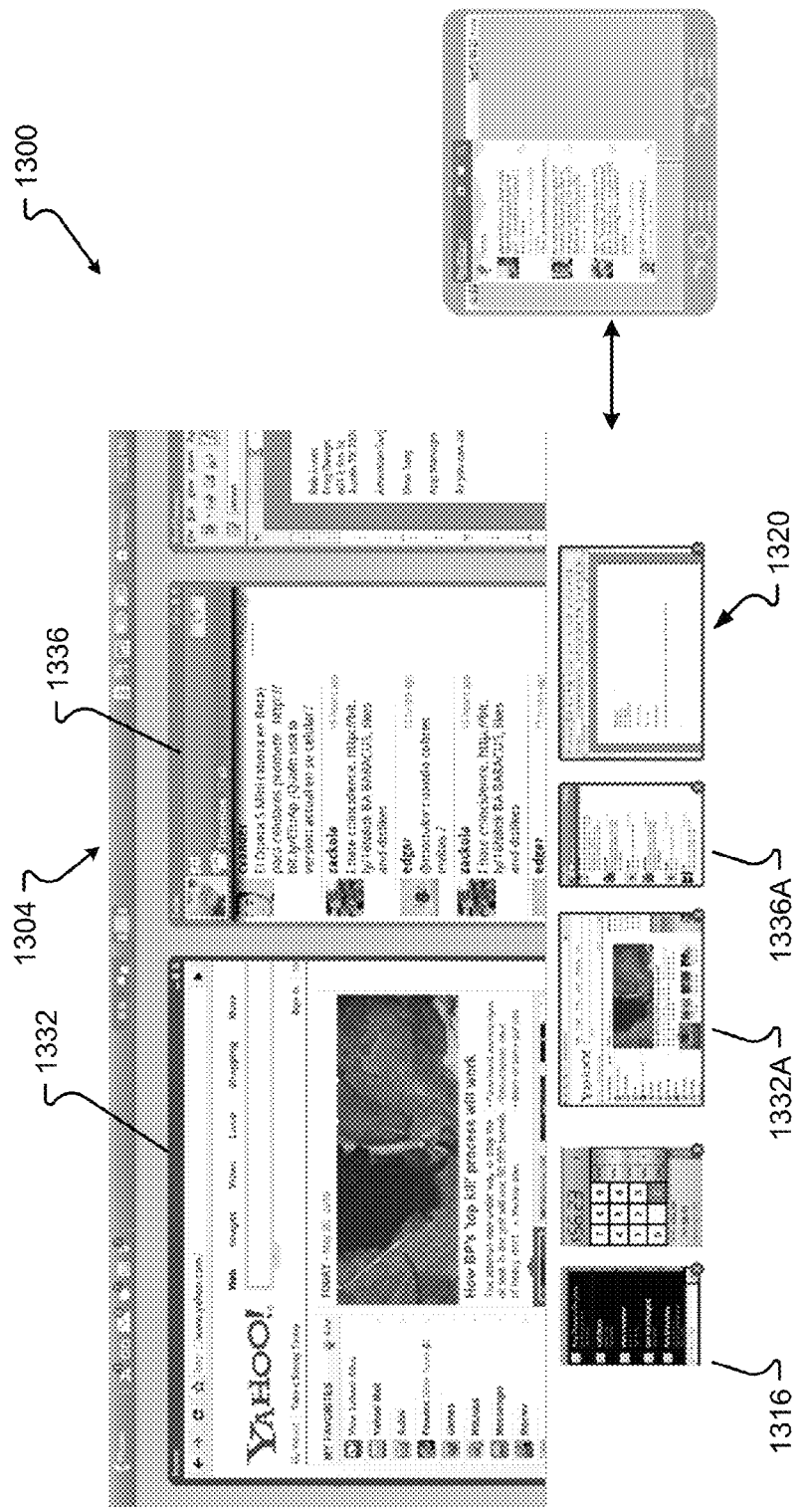
FIG. 15 is a representation of the unified desktop of FIG. 13 in linear mode.

FIG. 14 illustrates unified desktop 1300 with a plurality of windows of applications that are open, namely windows 1332 and 1336. As can be appreciated, windows 1332 and 1336 correspond to indications 1320 displayed in window 1316 of the application manager. FIG. 15 displays similar windows 1332 and 1336.

FIG. 14 illustrates unified desktop 1300 in a freeform mode, while FIG. 15 displays unified desktop 1300 in a linear mode. In a freeform mode, windows 1332 and 1336 may be positioned freely on the first portion 1304 of the unified desktop 1300. In other words, a user may have the windows 1332 and 1336 overlap, positioned on top of each other, or any other location on unified desktop 1300. In contrast, in linear mode, windows 1332 and 1336 are automatically aligned. The user does not have the option to move the windows 1332 and 1336 from their automatically aligned positions.

When in linear mode, windows 1332 and 1336 may be reordered. In one embodiment, a user would reorder the indications 1320 displayed within window 1316 of the application manager. As is shown in FIG. 15, indications 1320 include two indications 1332A and 1336A that correspond to windows 1332 and 1336. The indications are in the same order as the windows 1332 and 1336. Indications 1332A and 1336A may be reordered within window 1316. In some embodiments, such as the one shown in FIG. 15, windows 1332 and 1336 would be moved to reflect the order of the indications within window 1316.

Window 1316 of the application manager is also shown in FIG. 15 at the bottom of first portion 1304. This is merely one alternative to the location of window 1316. In other embodiments, window 1360 may be displayed on the right side as in FIGS. 13 and 14 on the left side of portion 1304, at the top of portion 1304 or any other convenient location.

In other embodiments, such as when unified desktop 1300 is in a freeform mode (FIG. 14), the order of indications 1332A and 1336A has no effect on the position or location of Windows 1332 in 1336. In these embodiments, the indications 1332A and 1336A may be reordered, but would not cause the windows 1332 and 1336 to move or be repositioned.

Figure 16:
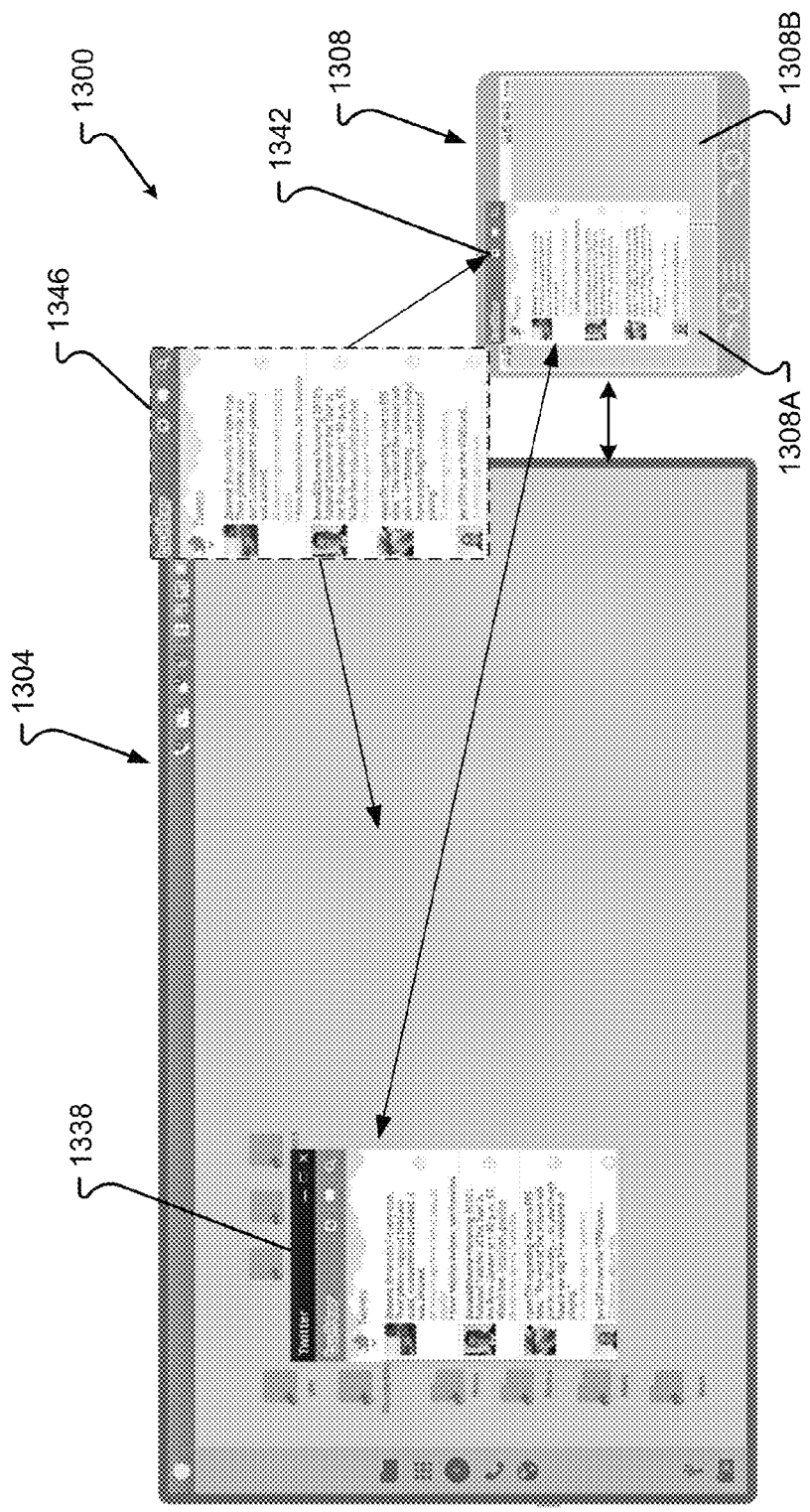
FIG. 16 is a representation of is a representation of the unified desktop of FIG. 13 with windows being opened and moved.

FIG. 16 illustrates unified desktop 1300 with at least one open window of an application. Window 1338 is opened in response to input received by the first portion 1304 of unified desktop 1300. Window 1338 corresponds to an application, in this example a social networking application. The unified desktop 1300 provides for opening a window of an application within the portion of the unified desktop where input is received indicating a request to open an application. Accordingly, if input is received for example in the second portion 1308 of unified desktop 1300, the window 1342 is opened in the second portion 1308, instead of window 1338 in first portion 1304.

Also, can be appreciated, second portion 1308 is spread across the two screens of device 100. Accordingly, in some embodiments unified desktop 1300 provides additional granularity and opens up a window within the particular screen where input was received. In other words, if input is received in area 1308A (as shown in FIG. 16) than window 1342 opens in area 1308A. However if the input is received in area 1308B, then window 1342 is opened in area 1308B.

In addition, opened windows may be freely moved from first portion 1304 to second portion 1308 and vice versa. In some embodiments, unified desktop 1300 may be configured to deal with situations in which an open window is not completely moved from one portion of unified desktop 1300 to another. For example, window 1346 has been moved to a location that is between the first portion 1304 and the second portion 1308. As can be appreciated, window 1346 is dragged and dropped in some embodiments using a mouse pointer. In other embodiments, a drag gesture for example on second portion 1308 may be used to effect the move of window 1346.

As a result of being moved to a location between the first portion 1304 and the second portion 1308, unified desktop 1300 may automatically reposition window 1346. In one embodiment, window 1346 is positioned back to its original position. In other embodiments, unified desktop 1300 may move window 1346 so that it is completely within one portion, either first portion 1304 or second portion 1308. For example, in a situation in which window 1346 has a first position originally on second portion 1308 and is moved to the location shown in FIG. 16, unified desktop 1300 may move window 1346 back to second portion 1308. In other embodiments, because window 1346 has been moved toward first portion 1304, unified desktop 1300 will move window 1346 to first portion 1304. These are merely some examples, and in other embodiments display of window 1346 may occur on both portions 1304 and 1308.

Figure 17:
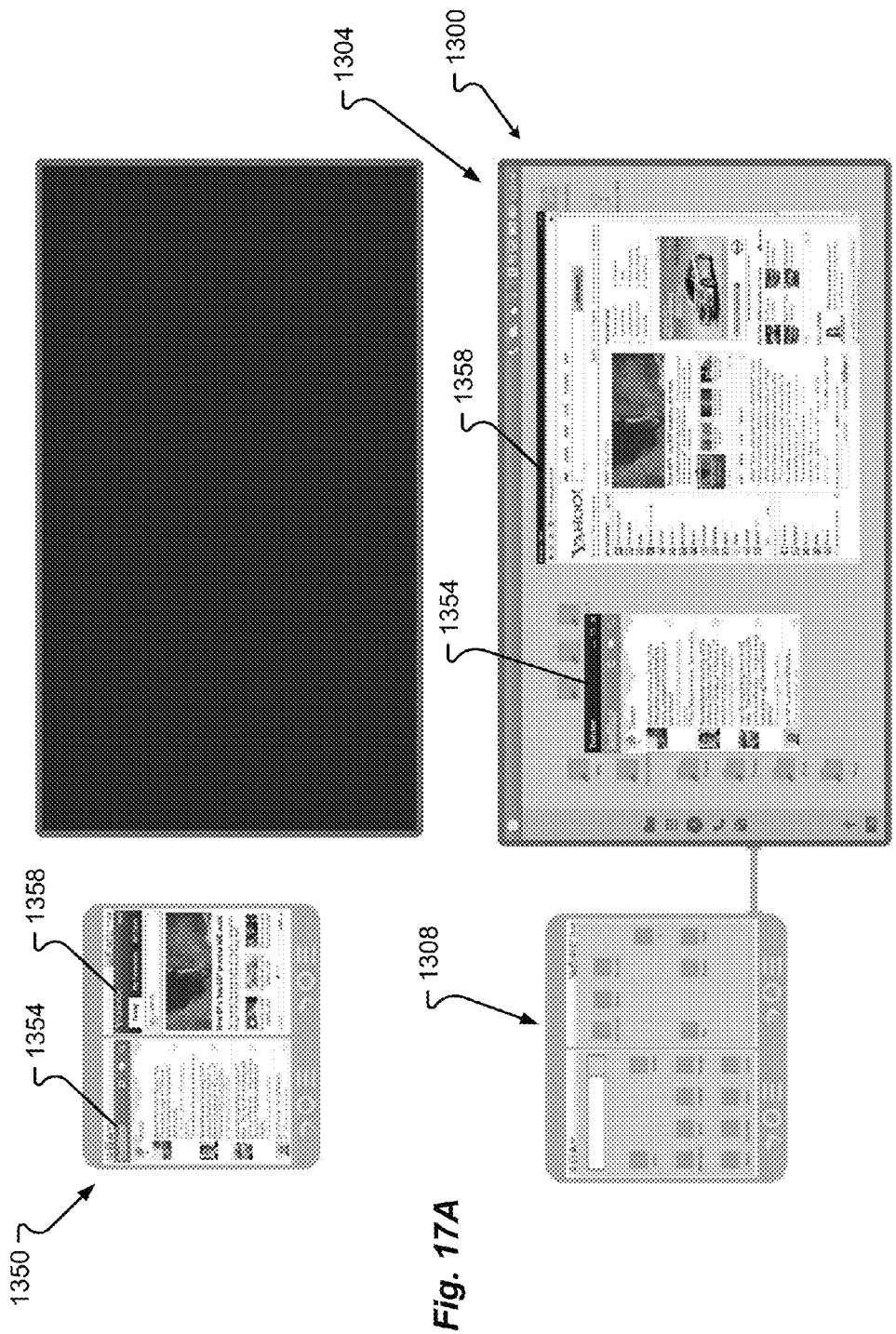
FIG. 17A is a representation of a desktop displayed by a handheld device before connection to a computer system.
FIG. 17B is a representation of a unified desktop displayed after the handheld device is connected to another computer system.

FIGS. 17A and 17B illustrate additional behavior of unified desktop 1300. In FIG. 17A, device 100 is not connected to computing system 1104. As a result, there is a first desktop 1350 that is displayed on one or more screens of device 100. In FIG. 17A two applications are open and displayed on desktop 1350, as is illustrated by the open windows 1354 and 1358.

FIG. 17B illustrates unified desktop 1300 after device 100 has been connected to a computer system 1104. As is shown in FIG. 17B, when device 100 is connected to the computer system 1104, unified desktop 1300 is displayed on device 100 and on a peripheral display of computer system 1104, with the first portion of unified desktop 1300 being displayed on the computer system 1104 and the first desktop 1350 acting as the second portion 1308 of unified desktop 1300. In addition, indications of the open applications are also displayed on the first portion 1304. In the embodiment shown in FIG. 17B, the indications are the open windows 1354 and 1358. In other embodiments, indications of the open applications may be displayed within a window of an application manager, such as window 1316 shown in FIGS. 13-15.

In other embodiments, a synchronization function may occur when device 100 is connected to a computer system 1104. FIGS. 17A and 17B illustrate synchronization of open applications on device 100 to computer system 1104. In some embodiments, any applications that are open on computer system 1104 are also synchronized to device 100. In these embodiments, similar steps may be performed. For example, when it is determined that applications are open on computer system 1104, indications of the open applications are displayed on device 100, namely on the second portion 1308 of unified desktop 1300. The indications may be open windows that are displayed on second portion 1308, or may be indications that are displayed within a window of an application manager such as window 1324 (FIG. 13).

Referring now to FIGS. 18-21, flow diagrams 1800, 1900, 2000, and 2100 in accordance with at least some embodiments of the present disclosure are shown and will be described. Flows 1800, 1900, 2000, and 2100 are in embodiments performed by a device such as device 100. More specifically, one or more hardware or software components may be involved in performing flows 1800, 1900, 2000, and 2100. In one embodiment, modules in middleware 520 (FIG. 5A) may perform one or more of the steps of flows 1800, 1900, 2000, and 2100. In other embodiments, in addition to, or in lieu of, middleware 520 performing steps of flows 1800, 1900, 2000, and 2100, operating system kernel(s) 516a, processor 504, and/or drivers 512a-512b may also perform steps of flows 1800, 1900, 2000, and 2100.

Figure 18:
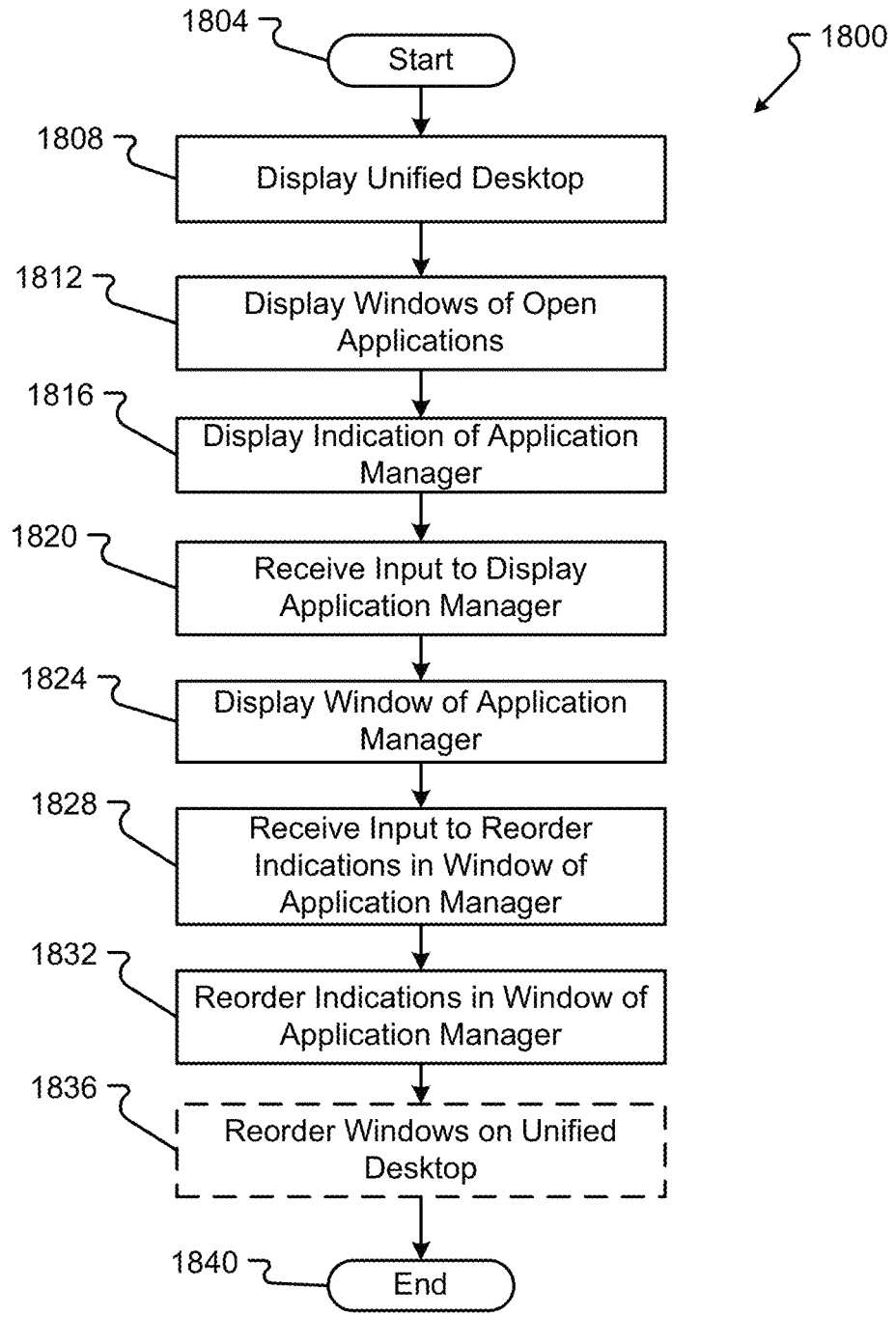
FIG. 18 is a flow chart of an embodiment of a method for displaying a window of an application manager and moving indications of application within the window of the application manager.

Referring to FIG. 18, flow 1800 starts at 1804. Flow 1800 passes from 1804 to step 1808 where a unified desktop is displayed. The unified desktop may include more than one portion, such as unified desktop 1300 (FIGS. 13-17), which includes first portion 1304 and the second portion 1308. The unified desktop may be displayed across one or more devices, such as a handheld computing device, and another computing system. In one embodiment, the handheld computing device is device 100 described above, which is connected to a computing system 1104. It is noted however that this is only one embodiment and the unified desktop that is displayed across more than one device is not necessarily limited to the features described above with respect to device 100 and computing system 1104. The unified desktop allows functionalities from more than one computing device to be unified. For example, the functionalities of a handheld computing device, such as a mobile phone/PDA can be integrated with functionality from a computing system, such as a personal computer (PC). The user can therefore have a seamless experience across the unified desktop and take advantage of functionality typical of both handheld computing devices and personal computers.

Flow 1800 passes from step 1808 to step 1812, where a number of windows of open applications are displayed on the unified desktop. The applications may be opened on either the device 100 or the computing system 1104. As a consequence, the windows may be displayed on a first portion of the unified desktop, e.g., user interface of a computing system, or on a second portion of the unified desktop, e.g., user interface of device 100.

At step 1816, an indication of an application manager is displayed. The application manager may provide a variety of functions. In one embodiment, the application manager keeps track of applications that are open on the unified desktop, and provides indications of the applications that are open on the unified desktop. The application manager may also provide additional functionality in other embodiments such as closing applications if there are problems with the applications, or there is not enough memory or other resources to run all of the open applications.

The indication displayed at step 1816 is in embodiments an icon. The icon may, in addition to providing an indication of the application manager, also provide additional information about the applications that are open on the unified desktop. For example, in some embodiments the indication may include a number of applications that are currently open on the unified desktop. In another embodiment, the indication may provide information regarding applications that are in an error state. For example, the indication may be one color, e.g. red, when one of the open applications is in an error state, and be another color, e.g. green, window applications are in an error state.

Indication of the application manager may be used to receive input, such as a request to open the application manager. At step 1820, input is received to display the application manager. The input may be for example clicking on the indication displayed at step 1816. In another embodiment, merely mousing over the indication displayed at step 1816 may be the input received at step 1820.

In response to step 1820, flow passes to step 1824 where a window of the application manager is displayed. In embodiments, the window of the application manager includes a number of indications corresponding to windows of open applications. For example, the window displayed at step 1824 may be similar to windows 1316 and/or 1324 (FIGS. 13-15). Flow passes from step 1824 to step 1828 where input is received to reorder the indications which are displayed in the window of the application manager. The input may be simply dragging and dropping the indications using a mouse and mouse pointer. In other embodiments, the input may involve highlighting an indication and moving the indication with a drag gesture, or arrows on a keyboard. In response to step 1828, the indications are reordered at step 1832.

Flow 1800 passes from step 1832 to optional step 1836 where the windows displayed at step 1812 are reordered on the unified desktop to correspond to the reordering in the window of the application manager. That is, the location of where the windows displayed on the unified desktop are displayed is changed in accordance with the reordering in the window of the application manager. In embodiments, step 1836 is performed when the unified desktop is in a linear mode. The linear mode indicates that the windows displayed in the unified desktop are automatically positioned in a row. Accordingly, if the order (of the indications displayed in the windows) is changed in the window of the application manager, the corresponding windows are changed in the unified desktop. Step 1836 is optional because in other embodiments, the unified desktop may be in a freeform mode, in which the windows displayed on the unified desktop are not automatically arranged. In this embodiment, the changes to the indications in the window of the application manager have no effect on the positions of the corresponding windows displayed on the unified desktop. Flow 1800 ends at step 1840.

Figure 19:
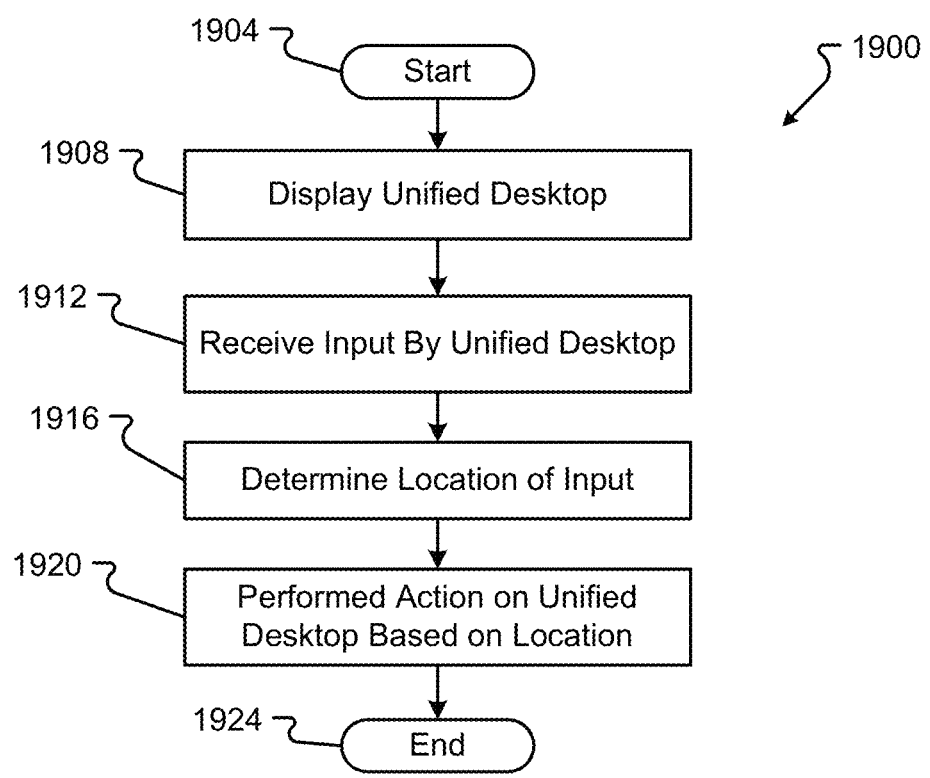
FIG. 19 is a flow chart of an embodiment of a method for performing actions on a unified desktop.

Referring now to FIG. 19, flow 1900 starts at 1904. Flow 1900 passes from 1904 to step 1908 where a unified desktop is displayed. The unified desktop may include more than one portion, such as unified desktop 1300 (FIGS. 13-17). The unified desktop may be displayed across one or more devices, such as a handheld computing device, and another computing system. In one embodiment, the handheld computing device is device 100 described above, which is connected to a computing system 1104.

After step 1908, flow 1900 passes to step 1912 where input is received by the unified desktop. The input may be a request to perform an action, some nonlimiting examples including open an application, close an application, move a window of an application, activate a window of an application, or resize a window of an application. The input may be made using a gesture, a mouse, a keyboard, a stylus, a pen, a voice command, or other input means.

The location of the input is determined at step 1916. The determination includes determining from which portion of the unified desktop the input is received. As noted above, in one embodiment, the unified desktop includes two portions, each of which are user interfaces of two different devices. The location of the input may be important for determining in which portion of the unified desktop an action should be performed. For example, if the input indicates a request to open an application, a window of the application will be opened on the portion of the unified desktop in which the input was received. If the input was received from the handheld device, then the window will open in the portion of the unified desktop provided by the handheld device. On the other hand, if the input was received from the computer system, then the window will be opened in the portion of the unified desktop provided by the computer system.

Step 1916 may also involve determining locations of a first input and a second input. For example, a user may move an open window of an application from one portion of the unified desktop to another portion of the unified desktop. In this example, step 1916 will determine a first position of the window by determining where an initial input was received, and then determine a second position of the window by determining where a second input was received. This may include for example determining when/where a gesture to move the window ends or a final location of where a mouse pointer is moved.

Flow 1900 and includes step 1920 where an action is performed on the unified desktop based on the determination of the location at step 1916. As noted above, the action may include in embodiments opening a window of an application, activating a window that may have been minimized, closing a window, resizing a window, and moving a window from one portion of the unified desktop to another. In other embodiments, the action may include changing a focus from one window to another window, from one portion of the unified desktop to another portion of unified desktop, and/or from one device providing a portion of the unified desktop to another device providing a second portion of the unified stop. Flow 1900 ends at 1924.

Figure 20:
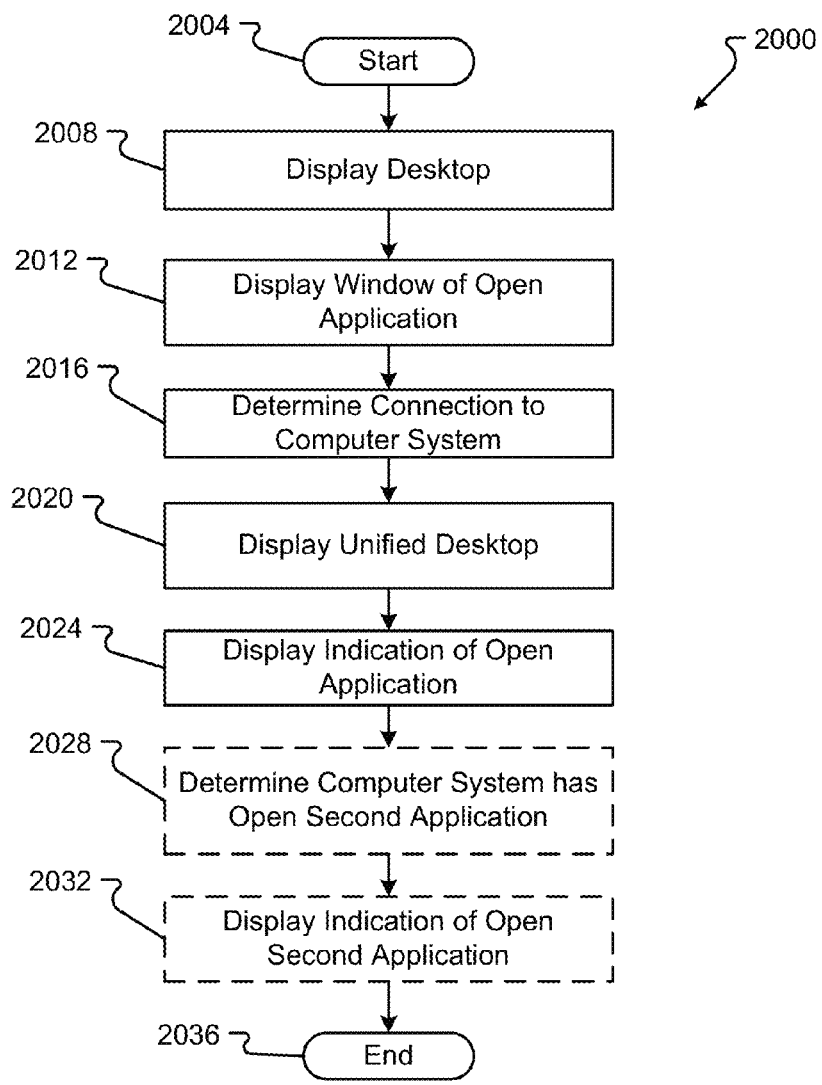
FIG. 20 is a flow chart of an embodiment of a method for displaying indications of open applications on portions of a unified desktop when two devices are connected and display the unified desktop.

Referring now to FIG. 20, flow 2000 starts at 2004. Flow 2000 passes from 2004 to step 2008 where a desktop is displayed. The desktop displayed at step 2008 is a standard user interface that may be provided by a handheld device, such as device 100, or a computer system such as 1104. The desktop allows a user to interact with the particular device displaying the desktop. In one embodiment, the desktop is displayed by handheld device such as device 100 described above.

Flow 2000 passes from step 2008 to step 2012 where a window of an open application is displayed on the desktop displayed at step 2008. In embodiments, the operating system of the handheld device displaying the desktop at step 2008 provide for open applications to display windows for a user to interact with the application. In embodiments, there may be more than one open application. Accordingly, at step 2012 more than one window will be displayed.

At step 2016, a determination is made that the handheld device performing the display steps 2008 and 2012, is connected to a computer system. In some embodiments, the computer system may be a system such as described above as computer system 1104. In other embodiments, the determination made at step 2016 is that the handheld device connected to a peripheral display that is not part of another computer system.

After the determination is made at step 2016, a unified desktop is displayed at step 2020. As noted above, the unified desktop may include more than one portion such as the unified desktop 1300 described above. The unified desktop is in embodiments displayed across more than one device, such as the handheld device and a peripheral display which may be part of another computer system. In one embodiment, the first portion of the unified desktop is displayed on the peripheral screen which as noted above may be part of another computer system, while the desktop displayed at step 2008 becomes a second portion of the unified desktop.

After step 2020, an indication of the open application is displayed on the unified desktop is performed at step 2024. Step 2024 may occur automatically as a result of the desktop displayed at 2018 becoming part of the unified desktop, since a window is already displayed on the desktop. In other embodiments, an indication may be displayed in another portion of the unified desktop. For example, the indication may be a window that is displayed on a portion of the unified desktop provided by the computer system. Step 2024 may involve moving the window displayed at step 2012 from its position on the first desktop to a portion of the unified desktop that is not provided by the handheld device. In other embodiments, step 2024 involves displaying the indication of the open application within a window of an application manager. The application manager window may open automatically as a result of the determination step 2016. In other embodiments, the application manager window will be opened as a result of receiving input from a user indicating a request to open the application manager.

Flow 2000 includes two optional steps 2028 and 2032. These optional steps are performed in embodiments in which the computer system to which the handheld device is connected also has some applications open. In these embodiments open applications are synchronized across the handheld device and the computer system. Steps 2028 and 2032 ensure that the handheld device synchronizes the applications that are open on the computer system. Accordingly, at step 2028 a determination is made that the computer system has an open application. At step 2032, an indication of the applications open on the computer system is displayed.

Step 2032 may occur automatically as a result of a desktop of the computer system displaying an open window of the application and becoming part of the unified desktop displayed at step 2020. In other embodiments, an indication may be displayed in another portion of the unified desktop. For example, the indication may be a window that is displayed on a portion of the unified desktop provided by the handheld device. Step 2032 may involve moving the open window from its position on a desktop of the computer system to a portion of the unified desktop that is not provided by the computer system. In other embodiments, step 2032 involves displaying the indication of the open application within a window of an application manager. The application manager window may open automatically as a result of the determination step 2016. In other embodiments, the application manager window will be opened as a result of receiving input from a user indicating a request to open the application manager. Flow 2000 ends at 2036.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method, comprising:
providing a unified system, wherein the unified system includes a multi-screen device, wherein the multi-screen device includes a first touch sensitive display on a first screen and a second touch sensitive display on a second screen, and a computer system, wherein the computer system includes a processor, a memory, an input device, and a peripheral screen;
wherein, in a first configuration, the multi-screen device is docked to the computer system and controls the multi-screen device and the computer system whereby the multi-screen device and the computer system appear to be a single system and, in a second configuration, the multi-screen device communicates wirelessly to the computer system; and
while in the first configuration or the second configuration:
displaying a unified desktop, by at least one processor of the multi-screen device, wherein the unified desktop provides information regarding applications open in the unified desktop, said information representing windows of applications that are currently open in the unified desktop displayed across the screens of the multi-screen device and the computer system, wherein at least a first portion of the unified desktop is displayed on the peripheral screen of the computer system, and a second portion of the unified desktop is displayed on at least one screen of the multi-screen device;
the multi-screen device receiving an input in the unified desktop; and
in response to the input:
the multi-screen device determining if a location of the input was received in the first portion of the unified desktop;
when the determined location of the input was received in the first portion of the unified desktop via the input device, the multi-screen device opening a window of an application in the first portion of the unified desktop based on the determined location; and
when the determined location of the input was received in the second portion of the unified desktop, the multi-screen device opening a window of an application in the second portion of the unified desktop based on the determined location.

2. The method of claim 1, wherein the multi-screen device is a handheld device, wherein the computer system is a personal computer, wherein the unified desktop unifies the personal computer functionality provided on the peripheral display with the handheld functionality provided on the screens of the multi-screen device.

3. The method of claim 2, wherein an application manager is displayable on each of the first and second portions, wherein the application manager provides the information, and wherein the information represents windows of applications that are currently open in the unified desktop in the first and second portions.

4. The method of claim 2, wherein, in a freeform mode, open windows may be positioned freely on the first portion of the unified desktop and, in a linear mode, windows are aligned automatically.

5. The method of claim 4, wherein the information is provided by indications that correspond to open windows, wherein the windows can be reordered in the linear mode by changing an order of the indications, and wherein the order of the indications is independent of the position of the windows in the first and second portions in the freeform mode.

6. The method of claim 4, wherein the unified desktop can move a window selected by a user input freely between the first and second portions.

7. The method of claim 5, wherein, when the multi-screen device is docked to the computer system, a synchronization function synchronizes the open applications and corresponding windows on each of the multi-screen device and the computer system to the other of the multi-screen device and the computer system, whereby the indications corresponding to the windows open in the first and second portions may be displayed by the application manager in each of the first and second portions.

8. The method of claim 2, wherein the first portion of the unified desktop displays windows not displayed on the second portion of the unified desktop.

9. A non-transitory computer readable medium storing computer executable instructions that when executed by at least one processor of a multi-screen device perform a method comprising:
establishing a unified system, wherein the unified system includes the multi-screen device, wherein the multi-screen device has a first touch sensitive display on a first screen and a second touch sensitive display on a second screen, and a computer system, wherein the computer system has a processor, a memory, an input device, and a peripheral screen;
wherein, in a first configuration, the multi-screen device is docked to the computer system and controls the multi-screen device and of the computer system whereby the multi-screen device and the computer system appear to be a single system and, in a second configuration, the multi-screen device communicates wirelessly to the computer system;
while in the first configuration or the second configuration:
displaying a unified desktop, by at least one processor of the multi-screen device, wherein the unified desktop is a cohesive user interface across at least a first and second screen of the multi-screen device and the peripheral screen, wherein the unified desktop provides information regarding applications open in the unified desktop, said information representing windows of applications that are currently open in the unified desktop displayed across the at least the first and second screen of the multi-screen device and the peripheral screen, wherein at least a first portion of the unified desktop is displayed on the peripheral screen of the computer system, and a second portion of the unified desktop is displayed on at least one screen of the multi-screen device;

receiving an input in the unified desktop; and in response to the input:

the multi-screen device determining a location on the unified desktop where the input was received;

when the determined location of the input was received in the first portion of the unified desktop via the input device, the multi-screen device opening a window of an application in the first portion of the unified desktop based on the determined location; and when the determined location of the input was received in the second portion of the unified desktop, the multi-screen device opening a window of an application in the second portion of the unified desktop based on the determined location.

10. The non-transitory computer readable medium of claim 9, wherein the multi-screen device is a handheld device, wherein the computer system is a personal computer, wherein the unified desktop unifies the personal computer functionality provided on the peripheral display with the handheld functionality provided on the screens of the multi-screen device.

11. The non-transitory computer readable medium of claim 10, wherein an application manager is displayable on each of the first and second portions, wherein the application manager provides the information, and wherein the information represents windows of applications that are currently open in the unified desktop in the first and second portions.

12. The non-transitory computer readable medium of claim 10, wherein, in a freeform mode, open windows may be positioned freely on the first portion of the unified desktop and, in a linear mode, windows are aligned automatically.

13. The non-transitory computer readable medium of claim 12, wherein the information is provided by indications that correspond to open windows, wherein the windows can be reordered in the linear mode by changing an order of the indications, and wherein the order of the indications is independent of the position of the windows in the first and second portions in the freeform mode.

14. The non-transitory computer readable medium of claim 12, wherein the unified desktop can move a window selected by a user input freely between the first and second portions.

15. The non-transitory computer readable medium of claim 13, wherein, when the multi-screen device is docked to the computer system, a synchronization function synchronizes the open applications and corresponding windows on each of the multi-screen device and the computer system to the other of the multi-screen device and the computer system, whereby the indications corresponding to the windows open in the first and second portions may be displayed by the application manager in each of the first and second portions.

16. The non-transitory computer readable medium of claim 10, wherein the first portion of the unified desktop displays windows not displayed on the second portion of the unified desktop.

17. A multi-screen communication device, comprising:
a first touch sensitive display on a first screen;
a second touch sensitive display on a second screen;
a computer readable medium that stores computer executable instructions that when executed by at least one processor perform a method comprising:

establishing a unified system, wherein the unified system includes the multi-screen device and a computer system having a processor, a memory, an input device, and a peripheral screen, wherein, in a first configuration, the multi-screen device is docked to the computer system and controls the multi-screen device and the computer system whereby the multi-screen device and the computer system appear to be a single system and, in a second configuration, the multi-screen device communicates wirelessly to the computer system; and while in the first configuration or the second configuration:

displaying a unified desktop, by at least one processor of the multi-screen device, wherein the unified desktop is a cohesive user interface across at least the first and second screen of the multi-screen device and the peripheral screen, wherein the unified desktop provides information regarding applications open in the unified desktop, said information representing windows of applications that are currently open in the uniform desktop displayed across the screens of the multi-screen device and the computer system, wherein at least a first portion of the unified desktop is displayed on the peripheral screen of the computer system, and a second portion of the unified desktop is displayed on at least one screen of the multi-screen device;

receiving an input in the unified desktop; and in response to the input:

the multi-screen device determining a location either in the first portion or the second portion on the unified desktop where the input was received;

when the determined location of the input was received in the first portion of the unified desktop via the input device, the multi-screen device opening a window of an application in the first portion of the unified desktop based on the determined location; and when the determined location of the input was received in the second portion of the unified desktop, the multi-screen device opening a window of an application in the second portion of the unified desktop based on the determined location.

18. The multi-screen communication device of claim 17, wherein the first portion of the unified desktop displays windows not displayed on the second portion of the unified desktop.

19. The multi-screen communication device of claim 17, wherein the multi-screen device is a handheld device, wherein the computer system is a personal computer, wherein the unified desktop unifies the personal computer functionality provided on the peripheral display with the handheld functionality provided on the screens of the multi-screen device, wherein an application manager is displayable on each of the first and second portions, wherein the application manager provides the information, wherein the information represents windows of applications that are currently open in the unified desktop in the first and second portions, wherein, in a freeform mode, open windows may be positioned freely on the first portion of the unified desktop and, in a linear mode, windows are aligned automatically, wherein the information is provided by indications that correspond to open windows, wherein the windows can be reordered in the linear mode by changing an order of indications, wherein the order of the indications is independent of the position of the windows in the first and second portions in the freeform mode, and wherein unified desktop can move a window selected by user input freely between the first and second portions.

* * * * *

UNITED STATES PATENT AND TRADEMARK OFFICE
CERTIFICATE OF CORRECTION

| | | |
|---|---|---|
| PATENT NO. | : 9,122,441 B2 | Page 1 of 1 |
| APPLICATION NO. | : 13/410958 | |
| DATED | : September 1, 2015 | |
| INVENTOR(S) | : Paul E. Reeves et al. | |

It is certified that error appears in the above-identified patent and that said Letters Patent is hereby corrected as shown below:

In the claims

At Column 46, line 25, please delete "uniform" and replace it with --unified-- therein.

Signed and Sealed this
Fifteenth Day of March, 2016

Michelle K. Lee
*Director of the United States Patent and Trademark Office*